(12) United States Patent
Nakamura et al.

(10) Patent No.: US 9,711,446 B2
(45) Date of Patent: Jul. 18, 2017

(54) RESIN COMPOSITION

(71) Applicant: Ajinomoto Co., Inc., Tokyo (JP)

(72) Inventors: Shigeo Nakamura, Kawasaki (JP);
Kazuhiko Tsurui, Kawasaki (JP);
Shiro Tatsumi, Kawasaki (JP)

(73) Assignee: Ajinomoto Co., Inc., Tokyo (JP)

( * ) Notice: Subject to any disclaimer, the term of this patent is extended or adjusted under 35 U.S.C. 154(b) by 0 days.

(21) Appl. No.: 15/363,166

(22) Filed: Nov. 29, 2016

(65) Prior Publication Data

US 2017/0154841 A1 Jun. 1, 2017

(30) Foreign Application Priority Data

Dec. 1, 2015 (JP) ................. 2015-234850

(51) Int. Cl.
*H05K 7/00* (2006.01)
*H01L 23/498* (2006.01)
*H01L 21/48* (2006.01)
*C08K 7/18* (2006.01)
*C08K 3/36* (2006.01)

(52) U.S. Cl.
CPC ......... *H01L 23/49894* (2013.01); *C08K 3/36* (2013.01); *C08K 7/18* (2013.01); *H01L 21/481* (2013.01); *H01L 21/4857* (2013.01); *H01L 23/49822* (2013.01); *C08K 2201/003* (2013.01); *C08K 2201/006* (2013.01)

(58) Field of Classification Search
USPC ........................................ 361/760, 748, 807
See application file for complete search history.

(56) References Cited

U.S. PATENT DOCUMENTS 7,709,939 B2 * 5/2010 Yonemura ........... H01L 21/4857
174/250
2009/0141472 A1 * 6/2009 Choi .................... C08G 59/621
361/820

FOREIGN PATENT DOCUMENTS

JP 2014-017301 A 1/2014

* cited by examiner

*Primary Examiner* — Andargie M Aychillhum
(74) *Attorney, Agent, or Firm* — Oblon, McClelland, Maier & Neustadt, L.L.P.

(57) ABSTRACT

Resin compositions containing (A) an epoxy resin, (B) a curing agent, and (C) an inorganic filler in which the content of (C) the inorganic filler is 55% by mass or higher with respect to 100% by mass of a non-volatile component within the resin composition, the average particle diameter of (C) the inorganic filler is 0.05 to 0.35 μm, the product of the specific surface area ($m^2/g$) of (C) the inorganic filler and the true density of (C) the inorganic filler is 1 to 77 $m^2/g$ and the moisture permeation of a cured product obtained by thermally cured the resin composition is 0.05 to 2.8 g·mm/$m^2$·24 h are useful for making printed wiring boards.

15 Claims, 1 Drawing Sheet

RESIN COMPOSITION

CROSS REFERENCES TO RELATED APPLICATIONS

This application claims priority to Japanese Patent Application No. 2015-234850, filed on Dec. 1, 2015, which is incorporated herein by reference in its entirety.

BACKGROUND OF THE INVENTION

Field of the Invention

The present invention relates to resin compositions. The present invention further relates to cured products containing such a resin composition, support-attached resin sheets, printed wiring boards including a cured product of such a resin composition, semiconductor devices, and methods for manufacturing a printed wiring board.

Discussion of the Background

A build-up method that alternately builds up a circuit-formed conductor layer and an insulating layer is widely used as a method for manufacturing a printed wiring board (hereinafter, also referred to as a "wiring board"). It is known that the insulating layer is formed by curing a resin composition (see, e.g., Japanese Patent Application Laid-open No. 2014-17301, which is incorporated herein by reference).

In recent years, along with the reduction in size and thickness of electronic devices, a further reduction in the thickness of printed wiring boards for use in the electronic devices is being advanced. To achieve the further reduction in the thickness of the printed wiring boards, it is desired that thickness of an inner layer board, an insulating layer, and the like used in the printed wiring boards be reduced.

Although the insulating resin sheet described in Japanese Patent Application Laid-open No. 2014-17301, which is incorporated herein by reference, is excellent in thin film insulation performance, via shape, surface smoothness, and embeddability, a further reduction in thickness is demanded. In addition, the insulating resin sheet tends to be likely to produce the amount of reflow warpage as the thickness of the insulating layer is reduced.

SUMMARY OF THE INVENTION

Accordingly, it is one object of the present invention to provide novel resin compositions.

It is another object of the present invention to provide novel resin compositions which are small in the amount of reflow warpage and are excellent in component embeddability and thin film insulation performance.

It is another object of the present invention to provide novel support-attached resin sheets which contain such a resin composition.

It is another object of the present invention to provide novel printed wiring boards which include a cured product of such a resin composition.

It is another object of the present invention to provide novel semiconductor devices.

It is another object of the present invention to provide novel methods for manufacturing a printed wiring board.

These and other objects, which will become apparent during the following detailed description, have been achieved by the inventors' examination of an insulating layer containing a large amount of an inorganic filler in order to reduce the tendency of the occurrence of the amount of reflow warpage as the thickness of the insulating layer is reduced and their discovery that when the content of the inorganic filler is high, component embeddability decreases, and besides, an electric current easily flows along interfaces on which inorganic filler particles adhere to each other, resulting in inferior thin film insulation performance. In other words, in terms of the amount of the inorganic filler, the amount of reflow warpage and component embeddability are in a trade-off relation, and the amount of reflow warpage and thin film insulation performance are also in a trade-off relation. The inventors of the present invention have also found out that in terms of the size of the inorganic filler, component embeddability and thin film insulation performance are in a trade-off relation.

The inventors of the present invention have conducted further examination to find out that when the average particle diameter of the inorganic filler and the product of the specific surface area of the inorganic filler and the true density of the inorganic filler are set to certain ranges, and besides, when the moisture permeation of a cured product obtained by thermally cured the resin composition is set to a certain range, the amount of reflow warpage, component embeddability, and thin film insulation performance become more favorable.

Thus, the present invention provides:

(1) A resin composition comprising:
(A) an epoxy resin;
(B) a curing agent; and
(C) an inorganic filler,
wherein
a content of (C) said inorganic filler is 55% by mass or higher with respect to 100% by mass of a non-volatile component within the resin composition,
an average particle diameter of (C) said inorganic filler is 0.05 to 0.35 μm,
a product of a specific surface area (m$^2$/g) of (C) said inorganic filler and a true density (g/cm$^3$) of (C) said inorganic filler is 1 to 77, and
a moisture permeation of a cured product obtained by thermally curing said resin composition is 0.05 to 2.8 g·mm/m$^2$·24 h.

(2) The resin composition according to (1), wherein the product of the specific surface area of said component (C) and the true density of said component (C) is 26 to 77.

(3) The resin composition according to (1) or (2), wherein the moisture permeation of said cured product obtained by thermally cured said resin composition is 0.05 to 2.5 g·mm/m$^2$·24 h.

(4) The resin composition according to any one of (1) to (3), wherein a boiling water absorption rate per hour of a cured product with a thickness of 40 μm and 4 cm square obtained by thermally curing said resin composition is 0.65% by mass or lower.

(5) The resin composition according to any one of (1) to (4), wherein an average coefficient of linear thermal expansion at 25° C. to 150° C. of said cured product obtained by thermally curing said resin composition is 26 ppm/° C. or lower.

(6) The resin composition according to any one of (1) to (5), wherein said component (C) is surface treated with at least one surface treating agent selected from the group consisting of a silane coupling agent, an alkoxysilane compound, and an organosilazane compound.

(7) The resin composition according to any one of (1) to (6), wherein said component (B) is one or more curing agents selected from the group consisting of an activated ester-based curing agent and a cyanate ester-based curing agent.

(8) A cured product obtained by thermally curing a resin composition according to any one of (1) to (7).

(9) A support-attached resin sheet, comprising:
a support, and
a resin composition layer comprising a resin composition according to any one of (1) to (7) provided on said support.

(10) The support-attached resin sheet according to (9), wherein said resin composition layer has a thickness of 12 μm or less.

(11) The support-attached resin sheet according to (9) or (10), wherein said resin composition layer has a lowest melt viscosity of 12,000 poise or less.

(12) A printed wiring board comprising:
an insulating layer formed of a cured product of said resin composition according to any one of (1) to (7);
a first conductor layer; and
a second conductor layer.

(13) The printed wiring board according to (12), wherein said insulating layer is between said first and said second conductor layers and has a thickness of 6 μm or less.

(14) A semiconductor device, comprising a printed wiring board according to (12) or (13).

(15) A method for manufacturing a printed wiring board, the method comprising:
(I) laminating a support-attached resin sheet according to any one of (9) to (11) such that said resin composition layer of the support-attached resin sheet bonds to an inner layer board; and
(II) thermally curing said resin composition layer to form an insulating layer.

(16) The method for manufacturing a printed wiring board according to (15), wherein
said printed wiring board comprises a first conductor layer and a second conductor layer, and
said insulating layer is between said first and said second conductor layers and has a thickness of 6 μm or less.

The present invention can provide a resin composition that is small in the amount of reflow warpage and is excellent in component embeddability and thin film insulation performance, a support-attached resin sheet containing the resin composition, a printed wiring board including a cured product of the resin composition, a semiconductor device, and a method for manufacturing a printed wiring board.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

REFERENCE SIGNS LIST

Figure 1:
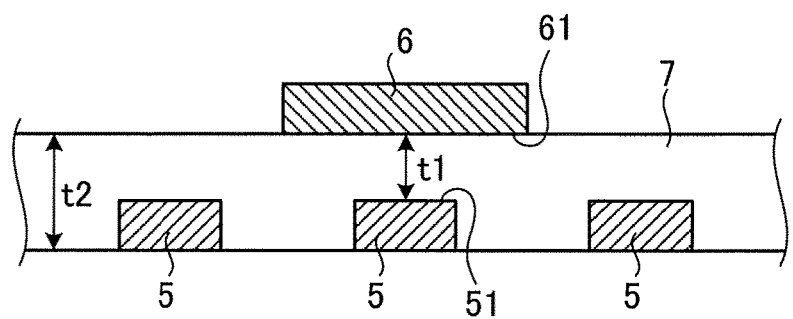
FIG. 1 is a schematic diagram of an example of a section for illustrating the thickness of an insulating layer between conductor layers.

100 Component temporarily mounting inner layer board (cavity board)
1 Inner layer board
1a Cavity
11 First principal face
12 Second principal face
2 Temporarily mounting material
3 Component
4 Circuit wiring
5 First conductor layer
51 Principal face of first conductor layer
6 Second conductor layer
61 Principal face of second conductor layer
7 Insulating layer

DETAILED DESCRIPTION OF THE PREFERRED EMBODIMENTS

The following describes a resin composition, a support-attached resin sheet containing the resin composition, a printed wiring board including a cured product of the resin composition, a semiconductor device, and a method for manufacturing a printed wiring board of the present invention in detail.

Resin Composition

The resin composition of the present invention is a resin composition containing (A) an epoxy resin, (B) a curing agent, and (C) an inorganic filler. The content of (C) the inorganic filler is 55% by mass or higher with respect to 100% by mass of a non-volatile component within the resin composition. The average particle diameter of (C) the inorganic filler is 0.05 to 0.35 μm. The product of the specific surface area ($m^2/g$) of (C) the inorganic filler and the true density ($g/cm^3$) of (C) the inorganic filler is 1 to 77. The moisture permeation of a cured product obtained by thermally cured the resin composition is 0.05 to 2.8 g·mm/$m^2$·24 h.

The following describes components contained in the resin composition of the present invention in detail.

(A) Epoxy Resin

Examples of the epoxy resin include bisphenol A type epoxy resins, bisphenol F type epoxy resins, bisphenol S type epoxy resins, bisphenol AF type epoxy resins, dicyclopentadiene type epoxy resins, trisphenol type epoxy resins, naphthol novolak type epoxy resins, phenol novolak type epoxy resins, tert-butyl-catechol type epoxy resins, naphthalene type epoxy resins, naphthol type epoxy resins, anthracene type epoxy resins, glycidyl amine type epoxy resins, glycidyl ester type epoxy resins, cresol novolak type epoxy resins, biphenyl type epoxy resins, linear aliphatic epoxy resins, epoxy resins having a butadiene structure, alicyclic epoxy resins, heterocyclic epoxy resins, spiro ring-containing epoxy resins, cyclohexanedimethanol type epoxy resins, naphthylene ether type epoxy resins, trimethylol type epoxy resins, tetraphenylethane type epoxy resins, and bixylenol type epoxy resins. One of the epoxy resins may be contained singly, or two or more of them may be contained in combination. The component (A) is preferably one or more selected from the bisphenol A type epoxy resins, the bisphenol F type epoxy resins, and the biphenyl type epoxy resins.

The epoxy resin preferably contains an epoxy resin having two or more epoxy groups in one molecule. With respect to 100% by mass of a non-volatile content of the epoxy resin, at least 50% by mass is preferably the epoxy resin having two or more epoxy groups in one molecule. Among them, the epoxy resin preferably contains an epoxy resin that has two or more epoxy groups in one molecule and is liquid at a temperature of 20° C. (hereinafter, referred to as a "liquid epoxy resin") and an epoxy resin that has three or more epoxy groups in one molecule and is solid at a temperature of 20° C. (hereinafter, referred to as a "solid epoxy resin"). The liquid epoxy resin and the solid epoxy resin are contained in combination as the epoxy resin, thereby providing a resin composition having excellent flexibility. The breaking strength of a cured product of the resin composition also increases.

Preferred examples of the liquid epoxy resin include bisphenol A type epoxy resins, bisphenol F type epoxy resins, bisphenol AF type epoxy resins, naphthalene type epoxy resins, glycidyl ester type epoxy resins, glycidyl amine type epoxy resins, phenol novolak type epoxy resins, alicyclic epoxy resins having an ester skeleton, cyclohexanedimethanol type epoxy resins, glycidyl amine type epoxy resins, and epoxy resins having a butadiene structure. More preferred ones include glycidyl amine type epoxy resins, bisphenol A type epoxy resins, bisphenol F type epoxy resins, bisphenol AF type epoxy resins, and naphthalene type epoxy resins. Specific examples of the liquid epoxy resin include "HP4032," "HP4032D," and "HP4032SS" (naphthalene type epoxy resins) manufactured by DIC Corporation; "828US" and "jER828EL" (bisphenol A type epoxy resins), "jER807" (a bisphe" "630LSD" (glycidyl amine type epoxy resins) manufactured by Mitsubishi Chemical Corporation; "ZX105"" (a mixed product of a bisphenol A type epoxy resin and a bisphenol F type epoxy resin) manufactured by Nippon Steel & Sumikin Chemical Co., Ltd.; "EX-721" (a glycidyl ester type epoxy resin) manufactured by Nagase ChemteX Corporation; "Celloxide 2021P" (an alicyclic epoxy resin having an ester skeleton) and "PB-3600" (an epoxy resin having a butadiene structure) manufactured by Daicel Corporation; "ZX1658" and "ZX1658GS" (liquid 1,4-glycidyl cyclohexane) manufactured by Nippon Steel & Sumikin Chemical Co., Ltd.; and "630LSD" (a glycidyl amine type epoxy resin) manufactured by Mitsubishi Chemical Corporation. One of these may be contained singly, or two or more of them may be contained in combination.

Preferred examples of the solid epoxy resin include naphthalene type tetrafunctional epoxy resins, cresol novolak type epoxy resins, dicyclopentadiene type epoxy resins, trisphenol type epoxy resins, naphthol type epoxy resins, biphenyl type epoxy resins, naphthylene ether type epoxy resins, anthracene type epoxy resins, bisphenol A type epoxy resins, and tetraphenylethane type epoxy resins. More preferred ones include naphthalene type tetrafunctional epoxy resins, naphthol type epoxy resins, and biphenyl type epoxy resins. Specific examples of the solid epoxy resin include "HP4032H" (a naphthalene type epoxy resin), "HP-4700" and "HP-4710" (naphthalene type tetrafunctional epoxy resins), "N-690" (a cresol novolak type epoxy resin), "N-695" (a cresol novolak type epoxy resin), "HP-7200," "HP-7200HH," and "HP-7200H" (dicyclopentadiene type epoxy resins), and "EXA-7311," "EXA-7311-G3," "EXA-7311-G4," "EXA-7311-G4S," and "HP6000" (naphthylene ether type epoxy resins) manufactured by DIC Corporation; "EPPN-502H" (a trisphenol type epoxy resin), "NC7000L" (a naphthol novolak type epoxy resin), "NC3000H," "NC3000," "NC3000L," and "NC3100" (biphenyl type epoxy resins) manufactured by Nippon Kayaku Co., Ltd.; "ESN475V" (a naphthalene type epoxy resin) and "ESN485" (a naphthol novolak type epoxy resin) manufactured by Nippon Steel & Sumikin Chemical Co., Ltd.; "YX4000H" and "YL6121" (biphenyl type epoxy resins), "YX4000HK" (a bixylenol type epoxy resin), and "YX880"" (an anthracene type epoxy resin) manufactured by Mitsubishi Chemical Corporation; "PG-100" and "CG-500" manufactured by Osaka Gas Chemicals Co., Ltd.; "YL7800" (a fluorene type epoxy resin) manufactured by Mitsubishi Chemical Corporation; and "jER1010" (a solid bisphenol A type epoxy resin) "jER1031S" (a tetraphenylethane type epoxy resin) and "YL7760" (a bisphenol AF type epoxy resin), manufactured by Mitsubishi Chemical Corporation.

The liquid epoxy resin is preferably an aromatic epoxy resin that has two or more epoxy groups in one molecule and is liquid at a temperature of 20° C. The solid epoxy resin is preferably an aromatic epoxy resin that has three or more epoxy groups in one group and is solid at a temperature of 20° C. The aromatic epoxy resin referred to in the present invention means an epoxy resin having an aromatic ring structure in its molecule.

When the liquid epoxy resin and the solid epoxy resin are contained in combination as the epoxy resin, the amount ratio between them (the liquid epoxy resin to the solid epoxy resin) is preferably in the range of 1:0.1 to 1:15 in terms of mass ratio. By setting the amount ratio between the liquid epoxy resin and the solid epoxy resin to that range, effects such as the following can be obtained: i) moderate adhesion can be obtained when used in the form of the support-attached resin sheet; ii) sufficient flexibility can be obtained and handling improves when used in the form of the support-attached resin sheet; and iii) a cured product having sufficient breaking strength can be obtained. In view of the i) to iii) effects, the amount ratio between the liquid epoxy resin and the solid epoxy resin (the liquid epoxy resin to the solid epoxy resin) is more preferably in the range of 1:0.3 to 1:12 and further preferably in the range of 1:0.6 to 1:10 in terms of mass ratio.

In view of obtaining an insulating layer exhibiting favorable mechanical strength and insulation reliability, the content of the epoxy resin in the resin composition is preferably 5% by mass or higher, more preferably 9% by mass or higher, and further preferably 13% by mass or higher. The upper limit of the content of the epoxy resin, which is not limited to a particular content so long as the effects of the present invention are exhibited, is preferably 50% by mass or lower and more preferably 40% by mass or lower.

In the present invention, the contents of the respective components in the resin composition are values with respect to 100% by mass of the non-volatile component in the resin composition unless otherwise specified.

The epoxy equivalent of the epoxy resin is preferably 50 to 5,000, more preferably 50 to 3,000, further preferably 80 to 2,000, and still further preferably 110 to 1,000. Being in this range makes the cross-linking density of the cured product sufficient and can provide the insulating layer with small surface roughness. The epoxy equivalent can be measured in accordance with JIS K 7236 and is the mass of a resin containing one equivalent of an epoxy group.

The weight average molecular weight of the epoxy resin is preferably 100 to 5,000, more preferably 250 to 3,000, and further preferably 400 to 1,500. The weight average molecular weight of the epoxy resin is a weight average molecular weight in terms of polystyrene measured by the gel permeation chromatography (GPC).

(B) Curing Agent

The curing agent is not limited to a particular curing agent so long as it has a function of curing the epoxy resin; examples thereof include phenol-based curing agents, naphthol-based curing agents, activated ester-based curing agents, benzoxazine-based curing agents, cyanate ester-based curing agents, and carbodiimide-based curing agents. One of the curers may be contained singly, or two or more of them may be contained in combination. The component (B) is preferably one or more selected from the phenol-based curing agents, the naphthol-based curing agents, the activated ester-based curing agents, and the cyanate ester-based curing agents, in view of reducing moisture permeation to improve thin film insulation performance, is more preferably one or more selected from the activated ester-based curing agents and the cyanate ester-based curing agents, and is further preferably the activated ester-based curing agents.

In view of heat resistance and water resistance, the phenol-based curing agents and the naphthol-based curing agents are preferably phenol-based curing agents having a novolak structure or naphthol-based curing agents having a novolak structure. In view of adhesiveness with a conductor layer, preferred ones include nitrogen-containing phenol-based curing agents, and more preferred ones include triazine skeleton-containing phenol-based curing agents. In view of highly satisfying heat resistance, water resistance, and the adhesiveness with the conductor layer, particularly preferred ones include triazine skeleton-containing phenol novolak curing agents.

Specific examples of the phenol-based curing agents and the naphthol-based curing agents include "MEH-7700," "MEH-7810," and "MEH-7851" manufactured by Meiwa Plastic Industries, Ltd.; "NHN," "CBN," and "GPH" manufactured by Nippon Kayaku Co., Ltd.; "SN170," "SN180," "SN190," "SN475," "SN485," "SN495," "SN375," and "SN395" manufactured by Nippon Steel & Sumikin Chemical Co., Ltd.; and "TD-2090," "LA-7052," "LA-7054," "LA-1356," "LA-3018-50P," and "EXB-9500" manufactured by DIC Corporation.

In view of obtaining the insulating layer excellent in the adhesiveness with the conductor layer, the activated ester-based curing agents are also preferred. The activated ester-based curing agents are not limited to a particular compound; preferred ones generally include compounds having two or more ester groups having high reaction activity in one molecule such as phenol esters, thiophenol esters, N-hydroxyamine esters, and esters of heterocyclic hydroxy compounds. The activated ester-based curing agents are preferably obtained by a condensation reaction of a carboxylic acid compound and/or a thiocarboxylic acid compound and a hydroxy compound and/or a thiol compound. In view of improving heat resistance in particular, preferred ones include activated ester-based curing agents obtained from the carboxylic acid compound and the hydroxy compound, and more preferred ones include activated ester-based curing agents obtained from the carboxylic acid compound and a phenol compound and/or a naphthol compound. Examples of the carboxylic acid compound include benzoic acid, acetic acid, succinic acid, maleic acid, itaconic acid, phthalic acid, isophthalic acid, terephthalic acid, and pyromellitic acid. Examples of the phenol compound or the naphthol compound include hydroquinone, resorcin, bisphenol A, bisphenol F, bisphenol S, phenolphthalein, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, dicyclopentadiene type diphenol compounds, and phenol novolaks. The "dicyclopentadiene type diphenol compound" refers to a diphenol compound obtained by causing two phenol molecules to condense with one dicyclopentadiene molecule.

Specifically, preferred ones include activated ester compounds containing a dicyclopentadiene type diphenol structure, activated ester compounds containing a naphthalene structure, activated ester compounds containing acetylated product of a phenol novolak, and activated ester compounds containing benzoylated product of a phenol novolak. Among them, more preferred ones include activated ester compounds containing a naphthalene structure and activated ester compounds containing a dicyclopentadiene type diphenol structure. The "dicyclopentadiene type diphenol structure" represents a divalent structural unit containing phenylene-dicyclopentylene-phenylene.

Examples of the commercially available product of the activated ester-based curing agents include "EXB9451," "EXB9460," "EXB9460S," "HPC-8000-65T," "HPC-8000H-65TM," and "EXB-8000L-65TM" (manufactured by DIC Corporation) as the activated ester compound containing a dicyclopentadiene type diphenol structure; "EXB9416-70BK" (manufactured by DIC Corporation) as the activated ester compound containing a naphthalene structure; "DC808" (manufactured by Mitsubishi Chemical Corporation) as the ester compound containing acetylide product of the phenol novolak; "YLH1026" (manufactured by Mitsubishi Chemical Corporation) as the activated ester compound containing benzoylated product of the phenol novolak; "DC808" (manufactured by Mitsubishi Chemical Corporation) as the activated ester-based curing agent, which is an acetylide product of a phenol novolak; "YLH1026" (manufactured by Mitsubishi Chemical Corporation), "YLH1030" (manufactured by Mitsubishi Chemical Corporation), and "YLH1048" (manufactured by Mitsubishi Chemical Corporation) as the activated ester-based curing agents, which are an benzoylated products of a phenol novolak.

Specific examples of the benzoxazine-based curing agent include "HFB2006M" manufactured by Showa Highpolymer Co., Ltd. and "P-d" and "F-a" manufactured by Shikoku Chemicals Corporation.

Examples of the cyanate ester-based curing agents include difunctional cyanate resins such as bisphenol A dicyanate, polyphenol cyanate, oligo(3-methylene-1,5-phenylenecyanate), 4,4'-methylenebis(2,6-dimethylphenyl cyanate), 4,4'-ethylidene diphenyl dicyanate, hexafluoro bisphenol A dicyanate, 2,2-bis(4-cyanate)phenylpropane, 1,1-bis(4-cyanatephenylmethane), bis(4-cyanate-3,5-dimethylphenyl) methane, 1,3-bis(4-cyanatephenyl-1-(methylethylidene)) benzene, bis(4-cyanatephenyl)thioether, and bis(4-cyanatephenyl)ether; polyfunctional cyanate resins derived from phenol novolak, cresol novolak, and the like; and prepolymers in which these cyanate resins are partially modified into triazine. Specific examples of the cyanate ester-based curing agents include "PT30" and "PT60" (both are phenol novolak type polyfunctional cyanate ester resins), "BA230" and "BA230S75" (prepolymers as trimers of bisphenol A dicyanate part or the whole of which is modified into triazine) manufactured by Lonza Japan Ltd.

Specific examples of the carbodiimide-based curing agents include "V-03" and "V-07" manufactured by Nisshinbo Chemical Inc.

The amount ratio between the epoxy resin and the curing agent, which is the ratio of (the total number of epoxy groups of the epoxy resin) the total number of reactive groups of the curing agent), is preferably in the range of 1:0.01 to 1:2, more preferably 1:0.015 to 1:1.5, and further preferably 1:0.02 to 1:1. The reactive group of the curing agent is an activated hydroxy group, an activated ester group, or the like and differs by the type of the curing agent. The total number of epoxy groups of the epoxy resin is a value obtained by totaling a value obtained by dividing the solid content mass of each epoxy resin by the epoxy equivalent for all the epoxy resins. The total number of reactive groups of the curing agent is a value obtained by totaling a value obtained by dividing the solid content mass of each curing agent by a reactive group equivalent for all the curing agents. By setting the amount ratio between the epoxy resin and the curing agent to that range, the heat resistance of the cured product of the resin composition further improves.

In one embodiment, the resin composition contains (A) the epoxy resin and (B) the curing agent. The resin composition preferably contains a mixture of the liquid epoxy resin and the solid epoxy resin (the mass ratio of the liquid epoxy resin to the solid epoxy resin is preferably 1:0.1 to 1:15, more preferably 1:0.3 to 1:12, and further preferably 1:0.6 to 1:10) as (A) the epoxy resin and one or more selected from the group consisting of the phenol-based curing agents, the naphthol-based curing agents, the activated ester-based curing agents, and the cyanate ester-based curing agents (preferably one or more selected from the group consisting of the activated ester-based curing agents and the cyanate ester-based curing agents) as (B) the curing agent.

The content of the curing agent in the resin composition, which is not limited to a particular content, is preferably 30% by mass or lower, more preferably 25% by mass or lower, and further preferably 20% by mass or lower. The lower limit thereof, which is not limited to a particular content, is preferably 2% by mass or higher.

(C) Inorganic Filler

Examples of the material of the inorganic filler include, but are not limited to, silica, alumina, glass, cordierite, silicon oxide, barium sulfate, barium carbonate, talc, clay, mica powder, zinc oxide, hydrotalcite, boehmite, aluminum hydroxide, magnesium hydroxide, calcium carbonate, magnesium carbonate, magnesium oxide, boron nitride, aluminum nitride, manganese nitride, aluminum borate, strontium carbonate, strontium titanate, calcium titanate, magnesium titanate, bismuth titanate, titanium oxide, zirconium oxide, barium titanate, barium titanate zirconate, barium zirconate, calcium zirconate, zirconium phosphate, and zirconium phosphate tungstate. Among them, a particularly preferred one is silica. Silica is preferably spherical silica. One of the inorganic fillers may be contained singly, or two or more of them may be contained in combination.

In view of highly filling the inorganic filler and improving thin film insulation performance, the average particle diameter of the inorganic filler is 0.35 µm or smaller, preferably 0.32 µm or smaller, more preferably 0.3 µm or smaller, and further preferably 0.29 µm or smaller. In view of improving dispersability in the resin composition, the lower limit of the average particle diameter is 0.05 µm or larger, preferably 0.06 µm or larger, and more preferably 0.07 µm or larger. Examples of the commercially available product of the inorganic filler having such an average particle diameter include "UFP-30" manufactured by Denka Company Limited and "SPH516-05" manufactured by Nippon Steel & Sumikin Materials Co., Ltd.

The average particle diameter of the inorganic filler can be measured by the laser diffraction and scattering method based on the Mie scattering theory. Specifically, the particle size distribution of the inorganic filler is created on a volume basis by a laser diffraction and scattering particle size distribution measuring apparatus, and its median diameter is measured as the average particle diameter. For a measurement sample, the inorganic filler dispersed in methyl ethyl ketone through ultrasonication can be preferably used. Examples of the laser diffraction and scattering particle size distribution measuring apparatus include "SALD-2200" manufactured by Shimadzu Corporation.

In view of reducing the lowest melt viscosity of the resin composition layer described below, the specific surface area of the inorganic filler is preferably 40 $m^2/g$ or smaller, more preferably 37 $m^2/g$ or smaller, and further preferably 33 $m^2/g$ or smaller. In view of maintaining appropriate viscoelasticity of the resin composition layer, the lower limit of the specific surface area is preferably 1 $m^2/g$ or larger, more preferably 5 $m^2/g$ or larger, and further preferably 10 $m^2/g$ or 15 $m^2/g$ or larger. The specific surface area can be measured using a fully automatic BET specific surface area measuring apparatus (Macsorb HM-1210 manufactured by Mountech Co., Ltd.), for example.

In view of improving dispersability in the resin composition layer, the true density of the inorganic filler is preferably 15 $g/cm^3$ or lower, more preferably 10 $g/cm^3$ or lower, and further preferably 5 $g/cm^3$ or lower. The lower limit of the true density is preferably 1 $g/cm^3$ or higher, more preferably 1.5 $g/cm^3$ or higher, and further preferably 2.0 $g/cm^3$ or higher. The true density can be measured using a micro ultrapycnometer (MUPY-21T manufactured by Quantachrome Instruments Japan G.K.), for example.

The product of the specific surface area ($m^2/g$) of the inorganic filler and the true density ($g/cm^3$) of the inorganic filler is 1 to 77, preferably 26 to 77, more preferably 30 to 70, and further preferably 35 to 70. When the product is in the range of 1 to 77, the amount of reflow warpage, component embeddability, and thin film insulation performance can be improved.

In view of increasing humidity resistance and dispersibility, the inorganic filler is preferably surface treated with at least one surface treating agent of a silane coupling agent, an alkoxysilane compound, and an organosilazane compound. These may be oligomers. Examples of the surface treating agent include aminosilane-based coupling agents, epoxysilane-based coupling agents, mercaptosilane-based coupling agents, silane-based coupling agents, organosilazane compounds, and titanate-based coupling agents. Examples of the commercially available product of the surface treating agent include "KBM403" (3-glycidoxypropyltrimethoxysilane) manufactured by Shin-Etsu Chemical Co., Ltd., "KBM803" (3-mercaptopropyltrimethoxysilane) manufactured by Shin-Etsu Chemical Co., Ltd., "KBE903" (3-aminopropyltriethoxysilane) manufactured by Shin-Etsu Chemical Co., Ltd., "KBM573" (N-phenyl-3-aminopropyltrimethoxysilane) manufactured by Shin-Etsu Chemical Co., Ltd., "SZ-31" (hexamethyldisilazane) manufactured by Shin-Etsu Chemical Co., Ltd., "KBM103" (phenyltrimethoxysilane) manufactured by Shin-Etsu Chemical Co., Ltd., and "KBM-4803" (a long-chain epoxy type silane coupling agent) manufactured by Shin-Etsu Chemical Co., Ltd. One of the surface treating agents may be contained singly, or two or more of them may be contained in combination.

The degree of surface treatment by the surface treating agent can be evaluated by the carbon amount per unit surface area of the inorganic filler. In view of improving the dispersibility of the inorganic filler, the carbon amount per unit surface area of the inorganic filler is preferably 0.02 $mg/m^2$ or larger, more preferably 0.1 $mg/m^2$ or larger, and further preferably 0.2 $mg/m^2$ or larger. In view of preventing increases in the melt viscosity of the resin varnish and melt viscosity in the form of a sheet, the carbon amount per unit surface area of the inorganic filler is preferably 1 $mg/m^2$ or lower, more preferably 0.8 $mg/m^2$ or lower, and further preferably 0.5 $mg/m^2$ or lower.

The carbon amount per unit surface area of the inorganic filler can be measured after the inorganic filler after being subjected to the surface treatment is subjected to washing treatment with a solvent (methyl ethyl ketone (MEK), for example). Specifically, a sufficient amount of MEK as the solvent is added to the inorganic filler subjected to the surface treatment with the surface treating agent. The surface treated inorganic filler is then subjected to ultrasonic cleaning at 25° C. for 5 minutes. The supernatant liquid is removed, the solid content is dried, and the carbon amount per unit surface area of the inorganic filler can be measured using a carbon analyzer. Examples of the carbon analyzer include "EMIA-320V" manufactured by Horiba Ltd.

In view of obtaining the insulating layer with a low average coefficient of linear thermal expansion, the content (filled amount) of the inorganic filler in the resin composition is 55% by mass or higher, preferably 58% by mass or higher, and more preferably 60% by mass or higher with respect to 100% of the non-volatile component in the resin composition. In view of improving embeddability and thin film insulation performance and the mechanical strength, especially the elongation of the insulating layer, the upper limit of the content of the inorganic filler in the resin composition is preferably 85% by mass or lower and more preferably 80% by mass or lower.

(D) Thermoplastic Resin

The resin composition of the present invention may contain (D) a thermoplastic resin in addition to the components (A) to (C).

Examples of the thermoplastic resin include phenoxy resins, polyvinyl acetal resins, polyolefin resins, polybutadiene resins, polyimide resins, polyamideimide resins, polyether imide resins, polysulfone resins, polyether sulfone resins, polyphenylene ether resins, polycarbonate resins, polyether ether ketone resins, and polyester resins, and preferred ones include phenoxy resins. One of the thermoplastic resins may be contained singly, or two or more of them may be contained in combination.

The weight average molecular weight in terms of polystyrene of the thermoplastic resin is preferably in the range of 8,000 to 70,000, more preferably in the range of 10,000 to 60,000, and further preferably in the range of 20,000 to 60,000. The weight average molecular weight in terms of polystyrene of the thermoplastic resin is measured by the gel permeation chromatography (GPC). Specifically, the weight average molecular weight in terms of polystyrene of the thermoplastic resin can be measured using LC-9A/RID-6A manufactured by Shimadzu Corporation as a measuring apparatus, Shodex K-800P/K-804L/K-804L manufactured by Showa Denko K.K. as a column, and chloroform or the like as a mobile phase at a column temperature of 40° C. and calculated using the calibration curve of the standard polystyrene.

Examples of the phenoxy resins include phenoxy resins having a skeleton of one or more selected from the group consisting of a bisphenol A skeleton, a bisphenol F skeleton, a bisphenol S skeleton, a bisphenol acetophenone skeleton, a novolak skeleton, a biphenyl skeleton, a fluorene skeleton, a dicyclopentadiene skeleton, a norbornene skeleton, a naphthalene skeleton, an anthracene skeleton, an adamantane skeleton, a terpene skeleton, and a trimethylcyclohexane skeleton. The terminal of the phenoxy resin may be any functional group such as a phenolic hydroxy group or an epoxy group. One of the phenoxy resins may be contained singly, or two or more of them may be contained in combination. Specific examples of the phenoxy resins include "1256" and "4250" (both are bisphenol A skeleton-containing phenoxy resins), "YX8100" (a bisphenol S skeleton-containing phenoxy resin), and "YX6954" (a bisphenol acetophenone skeleton-containing phenoxy resin) manufactured by Mitsubishi Chemical Corporation; "FX280" and "FX293" manufactured by Nippon Steel & Sumikin Chemical Co., Ltd.; and "YX6954BH30," "YX7553," "YX7553BH30," "YL7769BH30," "YL6794," "YL7213," "YL7290," and "YL7482" manufactured by Mitsubishi Chemical Corporation.

Examples of the polyvinyl acetal resins include a polyvinyl formal resin and a polyvinyl butyral resin, and a preferred one is a polyvinyl butyral resin. Specific examples of the polyvinyl acetal resins include "Denka Butyral 4000-2," "Denka Butyral 5000-A," "Denka Butyral 6000-C," and "Denka Butyral 6000-EP" manufactured by Denka Co., Ltd.; and the Eslek BH Series, BX Series (BX-5Z, for example), KS Series (KS-1, for example), BL Series, and BM Series manufactured by Sekisui Chemical Co., Ltd.

Specific examples of the polyimide resins include "Rikacoat SN20" and "Rikacoat PN20" manufactured by New Japan Chemical Co., Ltd. Other specific examples of the polyimide resins include modified polyimides such as a linear polyimide obtained by reacting a difunctional hydroxy group-terminated polybutadiene, a diisocyanate compound, and a quadribasic acid anhydride (the polyimide disclosed in Japanese Patent Application Laid-open No. 2006-37083, which is incorporated herein by reference in its entirety) and polysiloxane skeleton-containing polyimides (the polyimides disclosed in Japanese Patent Application Laid-open No. 2002-12667 and Japanese Patent Application Laid-open No. 2000-319386, both of which are incorporated herein by reference in their entireties).

Specific examples of the polyamideimide resins include "Vylomax HR11NN" and "Vylomax HR16NN" manufactured by Toyobo Co., Ltd. Other specific examples of the polyamideimide resins include modified polyamideimides such as "KS9100" and "KS9300" (polysiloxane skeleton-containing polyamideimides) manufactured by Hitachi Chemical Company, Ltd.

Specific examples of the polyether sulfone resins include "PES5003P" manufactured by Sumitomo Chemical Co., Ltd. Specific examples of the polyphenylene ether resins include oligo phenylene ether styrene resin "OPE-2st 1200" manufactured by Mitsubishi gas chemistry.

Specific examples of the polysulfone resins include Polysulfone "P1700" and "P3500" manufactured by Solvay Advanced Polymers.

Among them, the phenoxy resins and the polyvinyl acetal resins are preferred as the thermoplastic resin. Consequently, in a preferred embodiment, the thermoplastic resin contains one or more selected from the group consisting of the phenoxy resins and the polyvinyl acetal resins.

When the resin composition contains the thermoplastic resin, the content of the thermoplastic resin is preferably 0.5% by mass to 10% by mass, more preferably 0.6% by mass to 5% by mass, and further preferably 0.7% by mass to 3% by mass.

(E) Curing Promoter

The resin composition of the present invention may contain (E) a curing promoter in addition to Components (A) to (D).

Examples of the curing promoter include phosphorous-based curing promoters, amine-based curing promoters, imidazole-based curing promoters, guanidine-based curing promoters, and metal-based curing promoters. Preferred ones include phosphorous-based curing promoters, amine-based curing promoters, imidazole-based curing promoters, and metal-based curing promoters. More preferred ones include amine-based curing promoters, imidazole-based curing promoters, and metal-based curing promoters. One of the curing promoters may be contained singly, or two or more of them may be contained in combination.

Examples of the phosphorous-based curing promoters include triphenylphosphine, phosphonium borate compounds, tetraphenylphosphonium tetraphenyl borate, n-butylphosphonium tetraphenyl borate, tetrabutylphosphonium decanoate, (4-methylphenyl)triphenylphosphonium thiocyanate, tetraphenylphosphonium thiocyanate, and butyltriphenylphosphonium thiocyanate. Preferred ones include triphenylphosphine and tetrabutylphosphonium decanoate.

Examples of the amine-based curing promoters include trialkylamines such as triethylamine and tributylamine, 4-dimethylaminopyridine, benzyldimethylamine, 2,4,6-tris(dimethylaminomethyl)phenol, and 1,8-diazabicyclo(5,4,0)-undecene. Preferred ones include 4-dimethylaminopyridine and 1,8-diazabicyclo(5,4,0)-undecene.

Examples of the imidazole-based curing promoters include imidazole compounds such as 2-methylimidazole, 2-undecylimidazole, 2-heptadecylimidazole, 1,2-dimethylimidazole, 2-ethyl-4-methylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]ethyl-s-triazine, 2,4-diamino-6-[2'-methylimidazolyl-(1')]-ethyl-s-triazine isocyanuric acid adduct, 2-phenylimidazole isocyanuric acid adduct, 2-phenyl-4,5-dihydroxymethylimidazole, 2-phenyl-4-methyl-5-hydroxymethylimidazole, 2,3-dihydro-1H-pyrrolo[1,2-a]benzimidazole, 1-dodecyl-2-methyl-3-benzylimidazolium chloride, 2-methylimidazoline, and 2-phenylimidazoline. Preferred ones include 2-ethyl-4-methylimidazole and 1-benzyl-2-phenylimidazole and adducts of imidazole compounds and epoxy resins.

The imidazole-based curing promoters may be commercially available products; examples thereof include "P200-1150" manufactured by Mitsubishi Chemical Corporation.

Examples of the guanidine-based curing promoters include dicyandiamide, 1-methylguanidine, 1-ethylguanidine, 1-cyclohexylguanidine, 1-phenylguanidine, 1-(o-tolyl) guanidine, dimethylguanidine, diphenylguanidine, trimethylguanidine, tetramethylguanidine, pentamethylguanidine, 1,5,7-triazabicyclo[4.4.0]dec-5-ene, 7-methyl-1,5,7-triazabicyclo[4.4.0]dec-5-ene, 1-methylbiguanide, 1-ethylbiguanide, 1-n-butylbiguanide, 1-n-octadecylbiguanide, 1,1-dimethylbiguanide, 1,1-diethylbiguanide, 1-cyclohexylbiguanide, 1-allylbiguanide, 1-phenylbiguanide, and 1-(o-tolyl)biguanide. Preferred ones include dicyandiamide and 1,5,7-triazabicyclo[4.4.0]dec-5-ene.

Examples of the metal-based curing promoters include organic metal complexes or organic metal salts of metals such as cobalt, copper, zinc, iron, nickel, manganese, and tin. Specific examples of the organic metal complexes include organic cobalt complexes such as cobalt(II) acetylacetonate and cobalt(III) acetylacetonate; organic copper complexes such as copper(II) acetylacetonate; organic zinc complexes such as zinc(II) acetylacetonate; organic iron complexes such as iron(III) acetylacetonate; organic nickel complexes such as nickel(II) acetylacetonate; and organic manganese complexes such as manganese(II) acetylacetonate. Examples of the organic metal salts include zinc octanoate, tin octanoate, zinc naphthenate, cobalt naphthenate, tin stearate, and zinc stearate.

The content of the curing promoter in the resin composition, which is not limited to a particular content, is preferably 0.01% by mass to 3% by mass with respect to 100% by mass of the non-volatile components of the epoxy resin and the curing agent.

(F) Flame Retardant

The resin composition of the present invention may contain (F) a flame retardant. Examples of the flame retardant include organophosphorous-based flame retardants, organic nitrogen-containing phosphorous compounds, nitrogen compounds, silicone-based flame retardants, and metal hydroxides. One of the flame retardants may be contained singly, or two or more of them may be contained in combination.

The flame retardant may be a commercially available product; examples thereof include "HCA-HQ" manufactured by Sanko Co., Ltd. and "PX-200" manufactured by Daihachi Chemical Industry Co., Ltd.

When the resin composition contains the flame retardant, the content of the flame retardant, which is not limited to a particular content, is preferably 0.5% by mass to 20% by mass, more preferably 0.5% by mass to 15% by mass, and further preferably 0.5% by mass to 10% by mass.

(G) Organic Filler

In view of improving elongation, the resin composition may contain (G) an organic filler. The organic filler may be any organic filler that can be used when the insulating layer of the printed wiring board is formed; examples thereof include rubber particles, polyamide fine particles, and silicone particles.

The rubber particles may be commercially available products; examples thereof include "EXL-2655" manufactured by Dow Chemical Japan Ltd. and "AC3816N" manufactured by Ganz Chemical Co., Ltd.

When the resin composition contains the organic filler, the content of the organic filer is preferably 0.1% by mass to 20% by mass, more preferably 0.2% by mass to 10% by mass, and further preferably 0.3% by mass to 5% by mass or 0.5% by mass to 3% by mass.

(H) Optional Additives

The resin composition may further contain other additives as needed; examples of the other additives include organic metal compounds such as organic copper compounds, organic zinc compounds, and organic cobalt compounds and resin additives such as thickeners, antifoaming agents, leveling agents, adhesiveness imparting agents, and colorants.

The resin composition of the present invention provides a favorable insulating layer in terms of the amount of reflow warpage, component embeddability, and thin film insulation performance. Consequently, the resin composition of the present invention can suitably be used as a resin composition for forming the insulating layer of the printed wiring board (a resin composition for the insulating layer of the printed wiring board) and can be used as a resin composition for forming an interlayer insulating layer of the printed wiring board (a resin composition for the interlayer insulating layer of the printed wiring board) more suitably. In addition, the resin composition of the present invention is favorable in thin film insulation performance. Consequently, in the printed wiring board including the first conductor layer, the second conductor layer, and the insulating layer provided between the first conductor layer and the second conductor layer, for example, the insulating layer is formed of the resin composition of the present invention, whereby the thickness of the insulating layer between the first and the second conductor layers can be 6 μm or less (preferably 5.5 μm or less and more preferably 5 μm or less). The resin composition of the present invention provides a favorable insulating layer in terms of component embeddability and can suitably be used also when the printed wiring board is a circuit board with built-in component.

Cured Product

The cured product of the present invention is obtained by thermally cured the resin composition of the present invention. This cured product has a specific moisture permeation as described below in the section of Support-Attached Resin Sheet. Such a specific moisture permeation can be achieved by adjusting the amount of the component (C) in the resin composition, selecting resin components having high hydrophobicity as the resin components such as the component (A) and the component (D), or selecting one or more selected from the activated ester-based curing agents and the cyanate ester-based curing agents as the component (B). This cured product preferably has a specific boiling water absorption rate, average coefficient of linear thermal expansion, and insulation resistance value as described below in the section of Support-Attached Resin Sheet.

The thermal curing condition of the resin composition is not limited a particular condition, and a condition normally employed when the insulating layer of the printed wiring board is formed described below may be used, for example. Before being thermally cured, the resin composition may be preliminarily heated. The heating in the thermal curing condition may be performed a plurality of times including the preliminary heating. As an example, the resin composition is thermally cured first at 100° C. for 30 minutes, next at 175° C. for 30 minutes, and further at 190° C. for 90 minutes.

Support-Attached Resin Sheet

Although the resin composition of the present invention can be used by being applied in a varnish state, industrially in general, the resin composition of the present invention is preferably used in the form of a support-attached resin sheet including a resin composition layer formed of the resin composition.

In one embodiment, the support-attached resin sheet includes a support and the resin composition layer formed on the support, and the resin composition layer is formed of the resin composition of the present invention.

In view of reducing the thickness of the printed wiring board, the thickness of the resin composition layer is preferably 12 µm or less, more preferably 10 µm or less, further preferably 8 µm or less, and still further preferably 6 µm or less. The lower limit of the thickness of the resin composition layer, which is not limited to a particular thickness, can generally be 1 µm or more, 1.5 µm or more, 2 µm or more, or the like.

Examples of the support include films formed of plastic materials, metallic foils, and mold release paper, and preferred ones include films formed of plastic materials and metallic foils.

When the films formed of plastic material are used as the support, examples of the plastic material include polyesters such as polyethylene terephthalate (hereinafter, may be abbreviated as "PET") and polyethylene naphthalate (hereinafter, may be abbreviated as "PEN"); polycarbonate (hereinafter, may be abbreviated as "PC"); acrylic resins such as polymethylmethacrylate (PMMA); cyclic polyolefins, triacetylcellulose (TAC), polyether sulfide (PES), polyether ketone, and polyimide. Among them, preferred ones include polyethylene terephthalate and polyethylene naphthalate. A particularly preferred one is polyethylene terephthalate, which is inexpensive.

When the metallic foils are used as the support, examples of the metallic foils include copper foil and aluminum foil. A preferred one is copper foil. The copper foil may be foil formed of a copper single metal or foil formed of an alloy of copper and other metals (such as tin, chromium, silver, magnesium, nickel, zirconium, silicon, and titanium).

For the support, the face bonding to the resin composition layer may be subjected to matte treatment or corona treatment.

For the support, a mold release layer-attached support having a mold release layer on the face bonding to the resin composition layer may be used. Examples of a mold release agent for use in the mold release layer of the mold release layer-attached support include one or more mold release agents selected from the group consisting of alkyd resins, polyolefin resins, urethane resins, and silicone resins. The mold release layer-attached support may be a commercially available product; examples thereof include "SK-1," "AL-5," and "AL-7," manufactured by Lintec Corporation and "Lumirror T6AM" and "Lumirror R80" manufactured by Toray Industries, Inc., which are PET films having a mold release layer with an alkyd resin-based mold release agent as a main component.

The thickness of the support, which is not limited to a particular thickness, is preferably in the range of 5 µm to 75 µm and more preferably in the range of 10 µm to 60 µm. When the mold release layer-attached support is used, the thickness of the entire mold release layer-attached support is preferably in the ranges above.

The support-attached resin sheet can be manufactured by preparing a resin varnish in which the resin composition is dissolved in an organic solvent, applying this resin varnish to the support using a die coater or the like, and drying the resin varnish to form the resin composition layer, for example.

Examples of the organic solvent include ketones such as acetone, methyl ethyl ketone (MEK), and cyclohexanone; acetates such as ethyl acetate, butyl acetate, cellosolve acetate, propylene glycol monomethylether acetate, and carbitol acetate; carbitols such as cellosolve and butyl carbitol; aromatic hydrocarbons such as toluene and xylene; and amide-based solvents such as dimethylformamide, dimethylacetamide (DMAc), and N-methylpyrrolidone. One of the organic solvents may be used singly, or two or more of them may be used in combination.

The drying may be performed by a known method such as heating or hot-air blowing. Although the drying condition is not limited to a particular condition, the drying is performed such that the content of the organic solvent in the resin composition will be 10% by mass or lower and preferably 5% by mass or lower. Although varying depending on the boiling point of the organic solvent in the resin varnish, when the resin varnish containing 30% by mass to 60% by mass of the organic solvent is used, drying at 50° C. to 150° C. for 3 minutes to 10 minutes can form the resin composition layer, for example.

In the support-attached resin sheet, a protective film conforming to the support can further be laminated on the face that does not bond to the support of the resin composition layer (that is, the face opposite to the support). The thickness of the protective film, which is not limited to a particular thickness, is 1 µm to 40 µm, for example. Laminating the protective film can prevent the adherence of dust to or flaws on the surface of the resin composition layer. The support-attached resin sheet can be wound in a roll shape to be stored. When the support-attached resin sheet has the protective film, the protective film is peeled off to make the support-attached resin sheet available.

In view of obtaining favorable component embeddability, the lowest melt viscosity of the resin composition layer in the support-attached resin sheet is preferably 12,000 poise (1,200 Pa·s) or lower, more preferably 10,000 poise (1,000 Pa·s) or lower, and further preferably 8,000 poise (800 Pa·s) or lower, 5,000 poise (500 Pa·s) or lower, or 4,000 poise (400 Pa·s) or lower. In view of stably maintaining the thickness of the resin composition layer even when it is thin, the lower limit of the lowest melt viscosity is preferably 100 poise (10 Pa·s) or higher, more preferably 200 poise (20 Pa·s) or higher, and further preferably 250 poise (25 Pa·s) or higher.

The lowest melt viscosity of the resin composition layer refers to the lowest viscosity that the resin composition layer exhibits when the resin of the resin composition layer melts. Specifically, when the resin composition layer is heated at a constant temperature rising rate to melt the resin, the melt viscosity decreases as the temperature rises in the early stage, and after that, when a certain degree is passed, the melt viscosity increases as the temperature rises. The lowest melt viscosity refers to the minimum melt viscosity. The lowest melt viscosity of the resin composition layer can be measured by a dynamic viscoelastic method and can be measured in accordance with a method described in Measurement of Lowest Melt Viscosity described below, for example.

The moisture permeation of a cured product obtained by thermally curing the resin composition (or the resin composition layer) (a cured product obtained by thermally curing the resin composition at 100° C. for 30 minutes, next at 175° C. for 30 minutes, and further at 190° C. for 90 minutes, for example) shows a favorable result. In other words, the insulating layer showing a favorable moisture permeation is provided. The moisture permeation is 0.05 g·mm/m²·24 h or higher, preferably 0.1 g·mm/m²·24 h or higher, more preferably 0.15 g·mm/m²·24 h or higher, and further preferably 0.2 g·mm/m²·24 h or higher. The upper limit thereof is 2.8 g·mm/m²·24 h or lower, preferably 2.5 g·mm/m²·24 h or lower, further preferably 2.4 g·mm/m²·24 h or lower, and more preferably 2.3 g·mm/m²·24 h or lower. By setting the moisture permeation to 0.05 g·mm/m²·24 h or higher, when the resin composition is thermally cured, delamination caused by insufficient solvent volatilization can be prevented in the interface of the resin composition layer, which will not affect the subsequent process. By setting the moisture permeation to 2.8 g·mm/m²·24 h or lower, the thin film insulation performance of the cured product can be improved. Furthermore, by adjusting the contained components of the resin composition so as to obtain the moisture permeation in such a range and by setting the content of the component (C), the average particle diameter of the component (C), and the product of the specific surface area and the true density of the component (C) to the above ranges, the amount of reflow warpage and component embeddability, which are in a trade-off relation with thin film insulation performance, can also be improved. The moisture permeation can be measured in accordance with a method described in Measurement of Moisture Permeation described below.

The boiling water absorption rate per hour of a cured product with a thickness of 40 μm and 4 cm square obtained by thermally curing the resin composition (or the resin composition layer) (a cured product obtained by thermally cured the resin composition at 100° C. for 30 minutes, next at 175° C. for 30 minutes, and further at 190° C. for 90 minutes, for example) shows a favorable result. In other words, the insulating layer showing a favorable boiling water absorption rate is provided. The boiling water absorption rate is preferably 0.65% by mass or lower, more preferably 0.6% by mass or lower, and further preferably 0.58% by mass or lower. The upper limit thereof, which is not limited to a particular value, is preferably 0.01% by mass or higher, more preferably 0.05% by mass or higher, and further preferably 0.1% by mass or higher. By setting the boiling water absorption rate to 0.65% by mass or lower, the thin film insulation performance of the cured product can be improved. The boiling water absorption rate can be measured in accordance with a method described in Measurement of Boiling Water Absorption Rate described below.

The average coefficient of linear thermal expansion (CTE) of a cured product obtained by thermally cured the resin composition (or the resin composition layer) (a cured product obtained by thermally cured the resin composition at 100° C. for 30 minutes, next at 175° C. for 30 minutes, and further at 190° C. for 90 minutes, for example) shows a favorable value at 25 to 150° C. In other words, the insulating layer showing a favorable average coefficient of linear thermal expansion is provided. The average coefficient of linear thermal expansion at 25 to 150° C. is preferably 26 ppm/° C. or smaller and more preferably 25 ppm/° C. or smaller. The lower limit thereof, which is not limited to a particular value, is 0.1 ppm/° C. or larger. By setting the CTE to 26 ppm/° C. or smaller, the amount of reflow warpage of the cured product can be reduced. The average coefficient of linear thermal expansion can be measured in accordance with a method described in Measurement of Average Coefficient of Linear Thermal Expansion (CTE) of Cured Product of Support-Attached Resin Sheet described below.

An insulation resistance value after the elapse of 100 hours in an environment of 130° C., 85RH %, and the application of 3.3 V of a cured product obtained by thermally cured the resin composition (or the resin composition layer) (a cured product obtained by thermally cured the resin composition at 100° C. for 30 minutes, next at 175° C. for 30 minutes, and further at 190° C. for 90 minutes, for example) shows a favorable result. In other words, the insulating layer showing a favorable insulation resistance value is provided. The upper limit of the insulation resistance value is preferably $10^{12}\Omega$ or lower, more preferably $10^{11}\Omega$ or lower, and further preferably $10^{10}\Omega$ or lower. The lower limit thereof, which is not limited to a particular value, is preferably $10^{6}\Omega$ or higher and more preferably $10^{7}\Omega$ or higher. The measurement of the insulation resistance value can be measured in accordance with a method described in Evaluation of Insulation Reliability and Measurement of Thickness of Insulating Layer between Conductor Layers described below.

Printed Wiring Board and Method for Manufacturing Printed Wiring Board

The printed wiring board of the present invention includes the insulating layer formed of the cured product of the resin composition of the present invention, a first conductor layer, and a second conductor layer. The insulating layer is provided between the first conductor layer and the second conductor layer and insulates the first conductor layer and the second conductor layer from each other (the conductor layer is also referred to as a wiring layer). The insulating layer formed of the cured product of the resin composition of the present invention is excellent in thin film insulation performance, and even when the thickness of the insulating layer between the first and the second conductor layers is 6 μm or less, insulation performance is excellent.

The thickness of the insulating layer between the first and the second conductor layers is preferably 6 μm or less, more preferably 5.5 μm or less, and further preferably 5 μm or less. The lower limit thereof, which is not limited to a particular thickness, can be 0.1 μm or more. The thickness of the insulating layer between the first and the second conductor layers refers to a thickness t1 of an insulating layer 7 between a principal face 51 of a first conductor layer 5 and a principal face 61 of a second conductor layer 6 as exemplified in FIG. 1. The first and the second conductor layers are conductor layers adjacent to each other via the insulating layer, and the principal face 51 and the principal face 61 face each other. The thickness of the insulating layer between the first and the second conductor layers can be measured in accordance with a method described in Evaluation of Insulation Reliability and Measurement of Thickness of Insulating Layer between Conductor Layers described below.

A thickness t2 of the entire insulating layer is preferably 20 μm or less, more preferably 15 μm or less, and further preferably 12 μm or less. The lower limit thereof, which is not limited to a particular thickness, can be 1 μm or more.

The printed wiring board of the present invention can be manufactured by a method including the following processes (I) and (II) using the support-attached resin sheet:

(I) A process of laminating the support-attached resin sheet on an inner layer board such that the resin composition layer of the support-attached resin sheet will bond to the inner layer board; and (II) A process of thermally cured the resin composition layer to form the insulating layer.

The "inner layer board" used in the process (I) mainly refers to a board such as a glass epoxy board, a metallic board, a polyester board, a polyimide board, a BT resin board, or a thermosetting polyphenylene ether board or a circuit board in which a patterned conductor layer (a circuit) is formed on one side or both sides of the board. An inner layer circuit board, which is an intermediate product on which the insulating layer and/or the conductor layer will further be formed when the printed wiring board is manufactured, is also included in the "inner layer board" referred to in the present invention. When the printed wiring board is the circuit board with built-in component, the inner layer board that incorporates components can be used.

The lamination of the inner layer board and the support-attached resin sheet can be performed by thermocompression-bonding the support-attached resin sheet to the inner layer board from the support side, for example. Examples of a member for thermocompression-bonding the support-attached resin sheet to the inner layer board (hereinafter, also referred to as a "thermocompression bonding member") include a heated metallic plate (a SUS panel, for example) and a metallic roll (a SUS roll). Not directly pressing the thermocompression bonding member to the support-attached resin sheet, pressing is preferably performed via an elastic member such as heat-resistant rubber such that the support-attached resin sheet will sufficiently follow the surface irregularities of the inner layer board.

The lamination of the inner layer board and the support-attached resin sheet may be performed by vacuum lamination. In the vacuum lamination, the thermocompression bonding temperature is in the range of preferably 60° C. to 160° C. and more preferably 80° C. to 140° C. The thermocompression bonding pressure is in the range of preferably 0.098 MPa to 1.77 MPa and more preferably 0.29 MPa to 1.47 MPa. The thermocompression bonding time is in the range of preferably 20 seconds to 400 seconds and more preferably 30 seconds to 300 seconds. The lamination is preferably performed under a reduced pressure condition with a pressure of 26.7 hPa or lower.

The lamination can be performed by a commercially available vacuum laminator. Examples of the commercially available laminator include a vacuum pressurizing laminator manufactured by Meiki Co., Ltd. and a vacuum applicator manufactured by Nichigo-Morton Co., Ltd.

After the lamination, smoothening treatment on the laminated support-attached resin sheet may be performed by pressing the thermocompression bonding member from the support side, for example, under normal pressure (under atmospheric pressure). The pressing condition of the smoothening treatment can be similar to the thermocompression bonding condition of the lamination. The smoothening treatment can be performed by a commercially available laminator. The lamination and the smoothening treatment may be performed successively using the commercially available vacuum laminator.

The support may be removed between the process (I) and the process (II) or removed after the process (II).

At the process (II), the resin composition layer is thermally cured to form the insulating layer.

The thermal curing condition of the resin composition layer is not limited to a particular condition, and a condition normally employed when the insulating layer of the printed wiring board is formed may be used.

The thermal curing condition of the resin composition layer can be as follows, for example, although varying depending on the type of the resin composition or the like: the curing temperature is in the range of 120° C. to 240° C. (preferably in the range of 150° C. to 220° C. and more preferably in the range of 170° C. to 200° C.); and the curing time is in the range of 5 minutes to 120 minutes (preferably 10 minutes to 100 minutes and more preferably 15 minutes to 90 minutes).

Before the resin composition layer is thermally cured, the resin composition layer may be preliminarily heated at a temperature lower than the curing temperature. Before the resin composition layer is thermally cured, the resin composition layer may be preliminarily heated at a temperature of 50° C. or higher and lower than 120° C. (preferably 60° C. or higher and 110° C. or lower and more preferably 70° C. or higher and 100° C. or lower) for 5 minutes or longer (preferably 5 minutes to 150 minutes and more preferably 15 minutes to 120 minutes), for example.

In manufacturing the printed wiring board, (III) a process of drilling the insulating layer, (IV) a process of performing roughening treatment on the insulating layer, and (V) a process of forming a conductor layer may further be performed. These processes (III) to (V) may be performed in accordance with various kinds of methods known to those skilled in the art used for the manufacture of the printed wiring board. When the support is removed after the process (II), the removal of the support may be performed between the process (II) and the process (III), between the process (III) and the process (IV), or between the process (IV) and the process (V). The formation of the insulating layer and the conductor layer at the processes (II) to (V) may be repeatedly performed to form a multilayer wiring board as needed. In this case, the thickness of the insulating layer (t1 in FIG. 1) between the respective conductor layers is preferably in the above range.

The process (III) is a process of drilling the insulating layer, whereby holes such as via holes and through holes can be formed in the insulating layer. The process (III) may be performed using a drill, a laser, or plasma, for example, in accordance with the composition of the resin composition used for the formation of the insulating layer or the like. The dimensions and shape of the holes may be determined as appropriate in accordance with the design of the printed wiring board.

The process (IV) is a process of performing roughening treatment on the insulating layer. The procedure and the condition of the roughening treatment are not limited to particular ones, and a known procedure and condition that are normally used when the insulating layer of the printed wiring board is formed can be employed. The roughening treatment can be performed on the insulating layer by performing swelling treatment with a swelling liquid, roughening treatment with an oxidizer, and neutralization treatment with a neutralizing liquid in this order, for example. Examples of the swelling liquid include, but are not limited to, alkaline solutions and surfactant solutions. Preferred ones include alkaline solutions. More preferred alkaline solutions include a sodium hydroxide solution and a potassium hydroxide solution. Examples of commercially available swelling liquids include "Swelling Dip Securiganth P" and "Swelling Dip Securiganth SBU" manufactured by Atotech Japan K.K. The swelling treatment with the swelling liquid, which is not limited to particular treatment, can be performed by immersing the insulating layer in the swelling liquid at 30° C. to 90° C. for 1 minute to 20 minutes, for example. In view of reducing the swelling of the resin of the insulating layer to a moderate level, the cured product is preferably immersed in the swelling liquid at 40° C. to 80° C. for 5 minutes to 15 minutes. Examples of the oxidizer include, but are not limited to, an alkaline permanganic acid solution in which potassium permanganate or sodium permanganate is dissolved in an aqueous sodium hydroxide solution. The roughening treatment with the oxidizer such as the alkaline permanganic acid solution is preferably performed by immersing the insulating layer in an oxidizer solution heated at 60° C. to 80° C. for 10 minutes to 30 minutes. The concentration of the permanganate in the alkaline permanganic acid solution is preferably 5% by mass to 10% by mass. Examples of commercially available oxidizers include alkaline permanganate acid solutions such as "Concentrate Compact CP" and "Dosing Solution Securiganth P" manufactured by Atotech Japan K.K. The neutralizing liquid is preferably an acid aqueous solution; examples of the commercially available product thereof include "Reduction Solution Securiganth P" manufactured by Atotech Japan K.K. The treatment with the neutralizing liquid can be performed by immersing a treated surface subjected to the roughening treatment with the oxidizer in the neutralizing liquid at 30° C. to 80° C. for 5 minutes to 30 minutes. In view of workability and the like, a method is preferably employed that immerses an object subjected to the roughening treatment with the oxidizer in the neutralizing liquid at 40° C. to 70° C. for 5 minutes to 20 minutes.

In one embodiment, the arithmetic average roughness Ra of the surface of the insulating layer after the roughening treatment is preferably 400 nm or smaller, more preferably 350 nm or smaller, and further preferably 300 nm or smaller, 250 nm or smaller, 200 nm or smaller, 150 nm or smaller, or 100 nm or smaller. The arithmetic average roughness (Ra) of the surface of the insulating layer can be measured using a noncontact surface roughness meter. Specific examples of the noncontact surface roughness meter include "WYKO NT3300" manufactured by Veeco Instruments Inc.

The process (V) is a process of forming the conductor layer. When any conductor layer is not formed on the inner layer board, the process (V) is a process of forming the first conductor layer. When a conductor layer is formed on the inner layer board, the conductor layer is the first conductor layer, and the process (V) is a process of forming the second conductor layer.

A conductor material for use in the conductor layer is not limited to a particular material. In a preferred embodiment, the conductor layer contains one or more metals selected from the group consisting of gold, platinum, palladium, silver, copper, aluminum, cobalt, chromium, zinc, nickel, titanium, tungsten, iron, tin, and indium. The conductor layer may be a single metal layer or an alloy layer; examples of the alloy layer include layers formed of alloys of two or more metals selected from the above group (a nickel-chromium alloy, a copper-nickel alloy, or a copper-titanium alloy, for example). Among them, in view of the versatility, the costs, and the easy patterning for the formation of the conductor layer, preferred ones include a single metal layer of chromium, nickel, titanium, aluminum, zinc, gold, palladium, silver, or copper and an alloy layer of a nickel-chromium alloy, a copper-nickel alloy, or a copper-titanium alloy. More preferred ones include a single metal layer of chromium, nickel, titanium, aluminum, zinc, gold, palladium, silver, or copper and an alloy layer of a nickel-chromium alloy. A further preferred one is a single metal layer of copper.

The conductor layer may be a single layer structure or a multilayer structure in which two or more single metal layers or alloy layers formed of different kinds of metals or alloys are laminated together. When the conductor layer is the multilayer structure, the layer being in contact with the insulating layer is preferably a single metal layer of chromium, zinc, or titanium or an alloy layer of a nickel-chromium alloy.

The thickness of the conductor layer, which depends on a desired design of the printed wiring board, is generally 3 μm to 35 μm and preferably 5 μm to 30 μm.

In an embodiment, the conductor layer may be formed by plating. The surface of the insulating layer is plated by a known technique such as a semi-additive process or a full-additive process, whereby the conductor layer having a desired wiring pattern can be formed, for example. The following demonstrates an example that forms the conductor layer by the semi-additive process.

First, a plating seed layer is formed on the surface of the insulating layer by electroless plating. Next, a mask pattern that exposes part of the plating seed layer to be exposed in correspondence with a desired wiring pattern is formed on the formed plating seed layer. A metallic layer is formed on the exposed plating seed layer by electroplating, and the mask pattern is then removed. After that, an unnecessary seed layer is removed by etching or the like, whereby the conductor layer having the desired wiring pattern can be formed.

The resin composition of the present invention provides a favorable insulating layer in terms of component embeddability and can be used suitably even when the printed wiring board is the circuit board with built-in component.

A method for manufacturing such a circuit board with built-in component includes:

(i) a process of preparing a component temporarily mounting inner layer board including an inner layer board that has first and second principal faces facing each other and is formed with a cavity that passes through between the first and the second principal faces, a temporarily mounting material bonding to the second principal face of the inner layer board, and a component temporarily mounted by the temporarily mounting material within the cavity of the inner layer board;

(ii) a process of laminating the support-attached resin sheet of the present invention such that the resin composition layer will bond to the first principal face of the inner layer board;

(iii) a process of peeling off the temporarily mounting material from the second principal face of the inner layer board;

(iv) a process of laminating the support-attached resin sheet such that the resin composition layer will bond to the second principal face of the inner layer board; and (v) a process of thermally curing the resin composition layer.

Figure 2:
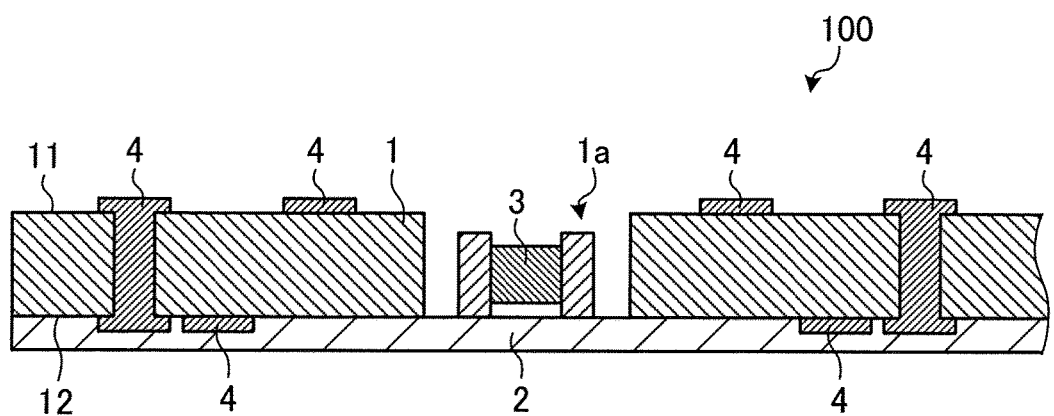
FIG. 2 is a schematic diagram of an example of a section of a component temporarily mounting inner layer board.

As FIG. 2 illustrates an example, a component temporarily mounting inner layer board 100 (also referred to as a "cavity board") includes an inner layer board 1 that has first and second principal faces 11 and 12 facing each other and is formed with a cavity 1a that passes through between the first and the second principal faces, a temporarily mounting material 2 bonding to the second principal face 12 of the inner layer board 1, and a component 3 temporarily mounted by the temporarily mounting material 2 within the cavity 1a of the inner layer board 1. The inner layer board 1 may include circuit wiring 4 such as via wiring and surface wiring.

The cavity formed in the inner layer board can be formed by a known method using a drill, a laser, plasma, or an etching medium, for example, considering the characteristics of the inner layer board. The cavity may be a plurality of cavities formed at certain intervals. The opening shape of the cavity, which is not limited to a particular shape, may be any shape such as a rectangular shape, a circular shape, a substantially rectangular shape, or a substantially circular shape.

The temporarily mounting material is not limited to a particular material so long as it has an adhesive face showing sufficient adhesiveness for temporarily mounting a component, and any known temporarily mounting material may be used in the manufacture of the circuit board with built-in component. Examples of the temporarily mounting material include PFDKE-1525TT (an adhesive-attached polyimide film) manufactured by Arisawa Mfg. Co., Ltd. and the UC Series (UV tapes for wafer dicing) manufactured by Furukawa Electric Co., Ltd.

The component is temporarily mounted on the adhesive face of the temporarily mounting material exposed via the cavity. For the component, an appropriate electric component may be selected in accordance with desired characteristics; examples thereof include passive components such as capacitors, inductors, resistors, and multilayer ceramic capacitors and active components such as semiconductor bare chips. The same component may be used for all the cavities, or different components may be used for each cavity.

The process (ii) is a process of laminating the support-attached resin sheet of the present invention such that the resin composition layer will bond to the first principal face of the inner layer board. The lamination conditions for the first principal face and the support-attached resin sheet are similar to the conditions of the process (I), and the preferred ranges are also similar thereto.

After laminating the resin composition layer on the first principal face of the inner layer board, the resin composition layer may be thermally cured. The conditions for thermally curing the resin composition layer are similar to the conditions of the process (II), and the preferred ranges are also similar thereto.

The process (iii) is a process of peeling off the temporarily mounting material from the second principal face of the inner layer board. The peeling of the temporarily mounting material may be performed in accordance with a known method in accordance with the type of the temporarily mounting material.

The process (iv) is a process of laminating the support-attached resin sheet such that the resin composition layer will bond to the second principal face of the inner layer board. The lamination conditions for the second principal face and the support-attached resin sheet are similar to the conditions of the process (I), and the preferred ranges are also similar thereto. The resin composition layer in the process (iv) may be the same resin composition layer as the resin composition layer in the process (ii) or a resin composition layer different therefrom. In the present invention, the support-attached resin sheet in the process (iv) is preferably the support-attached resin sheet of the present invention.

The process (v) is a process of thermally curing the resin composition layer. The conditions for thermally curing the resin composition layer are similar to the conditions of the process (II), and the preferred ranges are also similar thereto.

The method for manufacturing the circuit board with built-in component may further include a process of drilling the insulating layer (a drilling process), a process of performing roughening treatment on the surface of the insulating layer, and a process of forming a conductor layer on the roughened surface of the insulating layer. These processes are as described above.

The printed wiring board of the present invention may be an aspect including an insulating layer, which is the cured product of the resin composition layer of the support-attached resin sheet of the present invention and an embedded type wiring layer embedded in the insulating layer.

A method for manufacturing such a printed wiring board includes:

(1) a process of preparing a wiring layer-attached base having an inner layer board and a wiring layer provided at least on one face of the base;

(2) a process of laminating the support-attached resin sheet of the present invention on the wiring layer-attached base such that the wiring layer will be embedded in the resin composition layer and thermally curing the resin composition layer to form the insulating layer.

(3) a process of performing interlayer connection for the wiring layer; and (4) a process of removing the base.

Both faces of the inner layer board for use in this method of manufacture preferably have metallic layers formed of copper foil or the like. The metallic layer more preferably includes two or more metallic layers laminated together. The details of the process (1) include laminating a dry film (a photosensitive resist film) on the inner layer board, performing exposure and development under certain conditions using a photomask, and forming a patterned dry film. After forming the wiring layer by electroplating with the developed patterned dry film as a plating mask, the patterned dry film is peeled off.

The lamination conditions for the inner layer board and the dry film are similar to the conditions of the process (II), and the preferred ranges are also similar thereto.

After laminating the dry film on the inner layer board, to form a desired pattern on the dry film, exposure and development are performed under certain conditions using a photomask.

The line (a circuit width) and space (a width between circuits) ratio of the wiring layer, which is not limited to a particular ratio, is preferably 20/20 µm or lower (that is, the pitch is 40 µm or shorter), more preferably 18/18 µm or lower (the pitch is 36 µm or shorter), and further preferably 15/15 µm or lower (the pitch is 30 µm or shorter). The lower limit of the line and space ratio of the wiring layer, which is not limited to a particular ratio, is preferably 0.5/0.5 µm or higher and more preferably 1/1 µm or higher. The pitch is not required to be the same across the entire wiring layer.

After forming the dry film pattern, the wiring layer is formed, and the dry film is then peeled off. The formation of the wiring layer can be performed by plating using the dry film formed with the desired pattern as a plating mask.

A conductor material for use in the wiring layer is not limited to a particular material. In a preferred embodiment, the wiring layer contains one or more metals selected from the group consisting of gold, platinum, palladium, silver, copper, aluminum, cobalt, chromium, zinc, nickel, titanium, tungsten, iron, tin, and indium. The wiring layer may be a single metal layer or an alloy layer; examples of the alloy layer include layers formed of alloys of two or more metals selected from the above group (a nickel-chromium alloy, a copper-nickel alloy, or a copper-titanium alloy, for example).

The thickness of the wiring layer, which depends on a desired design of the wiring board, is preferably 3 µm to 35 µm, more preferably 5 µm to 30 µm, and further preferably 10 µm to 20 µm or 15 µm.

After forming the wiring layer, the dry film is peeled off. The peeling of the dry film can be performed by a known method. An unnecessary wiring pattern is removed by etching or the like as needed, whereby a desired wiring pattern can be formed.

The process (2) is a process of laminating the support-attached resin sheet of the present invention on the wiring layer-attached base such that the wiring layer will be embedded in the resin composition layer and thermally curing the resin composition layer to form the insulating layer. The lamination conditions for the wiring layer-attached base and the support-attached resin sheet are similar to the conditions of the process (II), and the preferred ranges are also similar thereto.

The process (3), which is not limited to a particular process so long as it can perform interlayer connection for the wiring layer, is preferably at least either of a process of forming via holes in the insulating layer to form a conductor layer or a process of polishing or grinding the insulating layer to expose the wiring layer. The process of forming the via holes in the insulating layer to form the conductor layer is as described above.

A method for polishing or a method for grinding the insulating layer is not limited to a particular method so long as it can expose the wiring layer and a polished or ground face is horizontal, and a known method of polishing or method of grinding can be used; examples thereof include a method of chemical mechanical polishing by a chemical mechanical polishing apparatus, a method of mechanical polishing such as buffing, and a method of planar grinding by grindstone rotation.

The process (4) is a process of removing the inner layer board to form the wiring board of the present invention. A method for removing the inner layer board is not limited to a particular method. In a preferred embodiment, the inner layer board is peeled off from the wiring board at the interface of the metallic layer on the inner layer board, and the metallic layer is removed by etching with an aqueous copper chloride solution, for example.

The wiring board manufactured using the resin composition and the support-attached resin sheet of the present invention shows a characteristic of being excellent in insulating reliability even when the thickness of the insulating layer between the first and the second conductor layers is 6 µm or less. The upper limit of the insulation resistance value after the elapse of 100 hours in an environment of 130° C., 85RH %, and the application of 3.3 V is preferably $10^{12}\Omega$ or lower, more preferably $10^{11}\Omega$ or lower, and further preferably $10^{10}\Omega$ or lower. The lower limit thereof, which is not limited to a particular value, is preferably $10^6\Omega$ or higher and more preferably $10^7\Omega$ or higher. The measurement of the insulation resistance value can be measured in accordance with a method described in Evaluation of Insulation Reliability and Measurement of Thickness of Insulating Layer between Conductor Layers described below.

The wiring board manufactured using the support-attached resin sheet of the present invention shows a characteristic of being component embeddability. In other words, for the circuit board with built-in component manufactured using the support-attached resin sheet of the present invention, the periphery of the components can be covered with the resin composition in all the cavities. The evaluation of component embeddability can be measured in accordance with a method described in Evaluation of Component Embeddability described below.

The wiring board manufactured using the support-attached resin sheet of the present invention shows a characteristic of being excellent in the amount of reflow warpage. The upper limit of the amount of reflow warpage at a peak temperature of 260° C. is preferably 90 µm, more preferably 80 µm, and further preferably 70 µM. The lower limit thereof, which is not limited to a particular value, can be 1 µm or larger. The evaluation of the amount of reflow amount can be measured in accordance with a method described in Evaluation of Amount of Warpage described below.

Semiconductor Device

The semiconductor device of the present invention includes the printed wiring board of the present invention. The semiconductor device of the present invention can be manufactured using the printed wiring board of the present invention.

Examples of the semiconductor device include various kinds of semiconductor devices for use in electric products (such as computers, cellular phones, digital cameras, and TVs), vehicles (such as motorcycles, automobiles, trains, ships, and aircraft), and the like.

The semiconductor device of the present invention can be manufactured by mounting a component (a semiconductor chip) at a conducting part of the printed wiring board. The "conducting part" is a "part that conveys electric signals in the printed wiring board" and may be on the surface or an embedded place. The semiconductor chip is not limited to a particular semiconductor chip so long as it is an electric circuit element formed of a semiconductor.

A method for mounting the semiconductor chip when the semiconductor device of the present invention is manufactured is not limited to a particular method so long as the semiconductor chip effectively functions. Specific examples thereof include a method of wire bonding mounting, a method of flip chip mounting, a method of mounting by Bumpless Build-up Layer (BBUL), a method of mounting by an anisotropic conductive film (ACF), and a method of mounting by a non-conductive film (NCF). The "method of mounting by Bumpless Build-up Layer (BBUL)" refers to a "method of mounting that directly embeds a semiconductor chip in a recess of a printed wiring board and connects the semiconductor chip and wiring on the printed wiring board."

Other features of the invention will become apparent in the course of the following descriptions of exemplary embodiments which are given for illustration of the invention and are not intended to be limiting thereof.

EXAMPLES

In the following description, "part(s)" and "%" mean "part(s) by mass" and "% by mass," respectively, unless otherwise specified.

The following first describes various kinds of methods of measurement and methods of evaluation.

Measurement of Average Particle Diameter

One hundred milligrams of an inorganic filler, 0.1 g of a dispersant ("SN9228" manufactured by San Nopco Limited), and 10 g of methyl ethyl ketone were weighed in a vial and were dispersed through ultrasonication for 20 minutes. Using a laser diffraction particle size distribution measuring apparatus ("SALD-2200" manufactured by Shimadzu Corporation), the particle size distribution was measured by a batch cell system to calculate an average particle diameter based on a median diameter.

Measurement of Specific Surface Area

Using a fully automatic BET specific surface area measuring apparatus (Macsorb HM-1210 manufactured by Mountech Co., Ltd.), the specific surface area of the inorganic filler was measured.

Measurement of True Density

Using a micro ultrapycnometer (MUPY-21T manufactured by Quantachrome Instruments Japan G.K.), the true density of the inorganic filler was measured.

Manufacture of Support-Attached Resin Sheet (Examples 1 to 3 and Comparative Examples 1 to 3)

Using resin varnishes (resin compositions) prepared by the following procedures, the support-attached resin sheets of the examples and the comparative examples were manufactured.

Preparation of Resin Varnish 1

Six parts of a bisphenol type epoxy resin ("ZX1059" manufactured by Nippon Steel & Sumikin Chemical Co., Ltd. with an epoxy equivalent of about 169, a 1:1 mixture of a bisphenol A type and a bisphenol F type), 6 parts of a bixylenol type epoxy resin ("YX4000HK" manufactured by Mitsubishi Chemical Corporation with an epoxy equivalent of about 185), 6 parts of a bisphenol AF type epoxy resin ("YL7760" manufactured by Mitsubishi Chemical Corporation with an epoxy equivalent of about 238), 15 parts of a naphthalene type epoxy resin ("ESN475V" manufactured by Nippon Steel & Sumikin Chemical Co., Ltd. with an epoxy equivalent of about 330), 10 parts of a phenoxy resin ("YX7553BH30" manufactured by Mitsubishi Chemical Corporation, a 1:1 (cyclohexanone and methyl ethyl ketone (MEK)) solution with a solid content of 30% by mass), and 2 parts of a flame retardant ("PX-200" manufactured by Daihachi Chemical Industry Co., Ltd.) were heated and dissolved in a mixed solvent of 20 parts of solvent naphtha and 10 parts of cyclohexanone with stirring. The mixture was cooled to room temperature. The mixture was then mixed with 30 parts of an activated ester-based curing agent ("HPC-8000-65T" manufactured by DIC Corporation with an active group equivalent of about 225, a toluene solution with a non-volatile content of 65% by mass), 2 parts of an amine-based curing promoter (4-dimethylaminopyridine (DMAP), an MEK solution with a solid content of 5% by mass), and 90 parts of spherical silica ("UFP-30" manufactured by Denka Co., Ltd. with an average particle diameter of 0.078 μm, a specific surface area of 30.7 $m^2/g$, and a carbon amount per unit surface area of 0.20 $mg/m^2$) subjected to surface treatment with an aminosilane-based coupling agent ("KBM573" manufactured by Shin-Etsu Chemical Co., Ltd.) and phenyltrimethoxysilane ("KBM103" manufactured by Shin-Etsu Chemical Co., Ltd.) in a weight ratio of 1:1, and the mixture was uniformly dispersed by a high-speed rotary mixer and was then filtered by a cartridge filter ("SHP020" manufactured by ROKITECHNO) to prepare Resin Varnish 1.

Preparation of Resin Varnish 2

Three parts of a glycidyl amine type epoxy resin ("630LSD" manufactured by Mitsubishi Chemical Corporation with an epoxy equivalent of about 95), 6 parts of a bixylenol type epoxy resin ("YX4000HK" manufactured by Mitsubishi Chemical Corporation with an epoxy equivalent of about 185), 6 parts of a naphthylene ether type epoxy resin ("EXA-7311-G4" manufactured by DIC Corporation with an epoxy equivalent of about 213), 15 parts of a biphenyl type epoxy resin ("NC3000L" manufactured by Nippon Kayaku Co., Ltd. with an epoxy equivalent of about 272), and 8 parts of a phenoxy resin ("YX7553BH30" manufactured by Mitsubishi Chemical Corporation, a 1:1 (cyclohexanone and methyl ethyl ketone (MEK)) solution with a solid content of 30% by mass) were heated and dissolved in a mixed solvent of 15 parts of solvent naphtha and 10 parts of cyclohexanone with stirring. The mixture was cooled to room temperature. The mixture was then mixed with 10 parts of a triazine skeleton-containing cresol novolak-based curing agent ("LA3018-50P" manufactured by DIC Corporation with a hydroxy group equivalent of about 151, a 2-methoxypropanol solution with a solid content of 50%), 10 parts of an activated ester-based curing agent ("HPC-8000-65T" manufactured by DIC Corporation with an active group equivalent of about 225, a toluene solution with a non-volatile content of 65% by mass), 1 part of an amine-based curing promoter (4-dimethylaminopyridine (DMAP), an MEK solution with a solid content of 5% by mass), 2 parts of rubber particles ("EXL2655" manufactured by Dow Chemical Japan Ltd.), and 120 parts of spherical silica ("SPH516-05" manufactured by Nippon Steel & Sumikin Materials Co., Ltd. with an average particle diameter of 0.29 μm, a specific surface area of 16.3 $m^2/g$, and a carbon amount per unit surface area of 0.43 $mg/m^2$) subjected to surface treatment with an aminosilane-based coupling agent ("KBM573" manufactured by Shin-Etsu Chemical Co., Ltd.), and the mixture was uniformly dispersed by a high-speed rotary mixer and was then filtered by a cartridge filter ("SHP020" manufactured by ROKITECHNO) to prepare Resin Varnish 2.

Preparation of Resin Varnish 3

Four parts of a naphthalene type epoxy resin ("HP4032SS" manufactured by DIC Corporation with an epoxy equivalent of about 144), 12 parts of a naphthylene ether type epoxy resin ("EXA-7311-G4" manufactured by DIC Corporation with an epoxy equivalent of about 213), 15 parts of a naphthalene type epoxy resin ("ESN475V" manufactured by Nippon Steel & Sumikin Chemical Co., Ltd. with an epoxy equivalent of about 330), and 5 parts of a phenoxy resin ("YX7553BH30" manufactured by Mitsubishi Chemical Corporation, a 1:1 (cyclohexanone and methyl ethyl ketone (MEK)) solution with a solid content of 30% by mass) were heated and dissolved in a mixed solvent of 15 parts of solvent naphtha and 10 parts of cyclohexanone with stirring. The mixture was then cooled to room temperature. The mixture was then mixed with 20 parts of a prepolymer of bisphenol A dicyanate ("BA230S75" manufactured by Lonza Japan Ltd. with a cyanate equivalent of about 232, an MEK solution with a non-volatile content of 75% by mass), 6 parts of a polyfunctional cyanate ester resin ("PT30" manufactured by Lonza Japan Ltd. with a cyanate equivalent of about 133, a solvent naphtha solution with a non-volatile content of 85% by mass), 8 parts of an activated ester-based curing agent ("HPC-8000-65T" manufactured by DIC Corporation with an active group equivalent of about 225, a toluene solution with a non-volatile content of 65% by mass), 0.3 Part of an amine-based curing promoter (4-dimethylaminopyridine (DMAP), an MEK solution with a solid content of 5% by mass), 2.5 parts of a curing promoter (cobalt(III) acetylacetonate (Co(III)Ac) manufactured by Tokyo Chemical Industry Co., Ltd., an MEK solution with a solid content of 1% by mass), 2 parts of a flame retardant ("HCA-HQ" manufactured by Sanko Co., Ltd., 10-(2,5-dihydroxyphenyl)-10-hydro-9-oxa-10-phosphaphenanthrene-10-oxide with an average particle diameter of 1.2 μm), 80 parts of spherical silica ("UFP-30" manufactured by Denka Co., Ltd. with an average particle diameter of 0.078 μm, a specific surface area of 30.7 m$^2$/g, and a carbon amount per unit surface area of 0.20 mg/m$^2$) subjected to surface treatment with an aminosilane-based coupling agent ("KBM573" manufactured by Shin-Etsu Chemical Co., Ltd.) and phenyltrimethoxysilane ("KBM103" manufactured by Shin-Etsu Chemical Co., Ltd.) in a weight ratio of 1:1, and 30 parts of spherical silica ("SPH516-05" manufactured by Nippon Steel & Sumikin Materials Co., Ltd. with an average particle diameter of 0.29 μm, a specific surface area of 16.3 m$^2$/g, and a carbon amount per unit surface area of 0.43 mg/m$^2$) subjected to surface treatment with an aminosilane-based coupling agent ("KBM573" manufactured by Shin-Etsu Chemical Co., Ltd.) (the mixed silica of the two having an average particle diameter of 0.13 μm and a specific surface area of 26.1 m$^2$/g), and the mixture was uniformly dispersed by a high-speed rotary mixer and was then filtered by a cartridge filter ("SHP020" manufactured by ROKITECHNO) to prepare Resin Varnish 3.

Preparation of Resin Varnish 4

As in the preparation of Resin Varnish 1, the inorganic filler was changed to spherical silica ("UFP-40" manufactured by Denka Co., Ltd. with an average particle diameter of 0.067 μm, a specific surface area of 40.8 m$^2$/g, and a carbon amount per unit surface area of 0.22 mg/m$^2$) subjected to surface treatment with an aminosilane-based coupling agent ("KBM573" manufactured by Shin-Etsu Chemical Co., Ltd.) and phenyltrimethoxysilane ("KBM103" manufactured by Shin-Etsu Chemical Co., Ltd.) in a weight ratio of 1:1. The others apart from the above point were performed similarly to those of the preparation of Resin Varnish 1 to prepare Resin Varnish 4.

Preparation of Resin Varnish 5

As in the preparation of Resin Varnish 3, 1) the added amount of solvent naphtha was changed from 15 parts to 10 parts, 2) the inorganic filler was changed to spherical silica ("Admafine SO-C1" manufactured by Admatechs Co., Ltd. with an average particle diameter of 0.63 μm, a specific surface area of 11.2 m$^2$/g, and a carbon amount per unit surface area of 0.35 mg/m$^2$) subjected to surface treatment with an aminosilane-based coupling agent ("KBM573" manufactured by Shin-Etsu Chemical Co., Ltd.), and 3) the cartridge filter ("SHP020" manufactured by ROKITECHNO) was changed to a cartridge filter ("SHP030" manufactured by ROKITECHNO). The others apart from the above points were performed similarly to those of the preparation of Resin Varnish 3 to prepare Resin Varnish 5.

Preparation of Resin Varnish 6

Four parts of a naphthalene type epoxy resin ("HP4032SS" manufactured by DIC Corporation with an epoxy equivalent of about 144), 7 parts of a bisphenol type epoxy resin ("ZX1059" manufactured by Nippon Steel & Sumikin Chemical Co., Ltd. with an epoxy equivalent of about 169, a 1:1 mixture of a bisphenol A type and a bisphenol F type), 15 parts of a biphenyl type epoxy resin ("NC3000L" manufactured by Nippon Kayaku Co., Ltd. with an epoxy equivalent of about 272), 4 parts of a naphthalene type epoxy resin ("HP-4710" manufactured by DIC Corporation with an epoxy equivalent of about 170), and 10 parts of a phenoxy resin ("YX7553BH30" manufactured by Mitsubishi Chemical Corporation, a 1:1 (cyclohexanone and methyl ethyl ketone (MEK)) solution with a solid content of 30% by mass) were heated and dissolved in a mixed solvent of 10 parts of solvent naphtha and 10 parts of cyclohexanone with stirring. The mixture was cooled to room temperature. The mixture was then mixed with 20 parts of a triazine skeleton-containing phenol novolak-based curing agent ("LA7052" manufactured by DIC Corporation with a hydroxy group equivalent of about 120, an MEK solution with a solid content of 60%), 0.5 part of an imidazole-based curing promoter ("1B2PZ" manufactured by Shikoku Chemicals Corporation, 1-benzyl-2-phenylimidazole, an MEK solution with a solid content of 5%), 2 parts of a flame retardant ("HCA-HQ" manufactured by Sanko Co., Ltd., 10-(2,5-dihydroxyphenyl)-10-hydro-9-oxa-10-phosphaphenanthrene-10-oxide with an average particle diameter of 1.2 μm), and 80 parts of spherical silica ("SPH516-05" manufactured by Nippon Steel & Sumikin Materials Co., Ltd. with an average particle diameter of 0.29 μm, a specific surface area of 16.3 m$^2$/g, and a carbon amount per unit surface area of 0.43 mg/m$^2$) subjected to surface treatment with an aminosilane-based coupling agent ("KBM573" manufactured by Shin-Etsu Chemical Co., Ltd.), and the mixture was uniformly dispersed by a high-speed rotary mixer and was then filtered by a cartridge filter ("SHP020" manufactured by ROKITECHNO) to prepare Resin Varnish 6.

The components contained in Resin Varnishes 1 to 6 and their added amounts (parts by mass of the non-volatile contents) are listed in the following table.

|  |  | Resin composition 1 | Resin composition 2 | Resin composition 3 | Resin composition 4 | Resin composition 5 | Resin composition 6 |
|---|---|---|---|---|---|---|---|
| Component (A) | YX4000HK | 6 | 6 | 0 | 6 | 0 | 0 |
|  | ESN-475V | 15 | 0 | 15 | 15 | 15 | 0 |
|  | EXA7311-G4 | 0 | 6 | 12 | 0 | 12 | 0 |

-continued

|  |  | Resin composition 1 | Resin composition 2 | Resin composition 3 | Resin composition 4 | Resin composition 5 | Resin composition 6 |
|---|---|---|---|---|---|---|---|
|  | NC3000L | 0 | 15 | 0 | 0 | 0 | 15 |
|  | HP4710 | 0 | 0 | 0 | 0 | 0 | 4 |
|  | ZX1059 | 6 | 0 | 0 | 6 | 0 | 7 |
|  | YL7760 | 6 | 0 | 0 | 6 | 0 | 0 |
|  | 630LSD | 0 | 3 | 0 | 0 | 0 | 0 |
|  | HP4032SS | 0 | 0 | 4 | 0 | 4 | 4 |
| Component (B) | HPC-8000-65T | 19.5 | 6.5 | 5.2 | 19.5 | 5.2 | 0 |
|  | LA-3018-50P | 0 | 5 | 0 | 0 | 0 | 0 |
|  | BA230S75 | 0 | 0 | 15 | 0 | 15 | 0 |
|  | PT30 | 0 | 0 | 5.1 | 0 | 5.1 | 0 |
|  | LA7052 | 0 | 0 | 0 | 0 | 0 | 12 |
| Component (C) | UFP-30 | 90 | 0 | 80 | 0 | 0 | 0 |
|  | SPH516-05 | 0 | 120 | 30 | 0 | 0 | 80 |
|  | UFP-40 | 0 | 0 | 0 | 90 | 0 | 0 |
|  | SO-C1 | 0 | 0 | 0 | 0 | 110 | 0 |
| Component (D) | YL7553BH30 | 3 | 2.4 | 1.5 | 3 | 1.5 | 3 |
| Component (E) | DMAP | 0.1 | 0.05 | 0.015 | 0.1 | 0.015 | 0 |
|  | Co(III)Ac | 0 | 0 | 0.025 | 0 | 0.025 | 0 |
|  | 1B2PZ | 0 | 0 | 0 | 0 | 0 | 0.025 |
| Component (F) | PX-200 | 2 | 0 | 0 | 2 | 0 | 0 |
|  | HCA-HQ | 0 | 0 | 2 | 0 | 2 | 2 |
| Component (G) | EXL2655 | 0 | 2 | 0 | 0 | 0 | 0 |
| Total |  | 114.600 | 135.950 | 142.840 | 114.600 | 142.840 | 101.025 |
| Content of inorganic filler (% by mass) |  | 61.0 | 72.3 | 64.8 | 61.0 | 64.8 | 63.0 |
| Content of activated ester (% by mass) |  | 13.2 | 3.9 | 3.1 | 13.2 | 3.1 | 0 |

Manufacture of Support-Attached Resin Sheet

As a support, a PET film ("Lumirror R80" manufactured by Toray Industries, Inc., with a thickness of 38 μm and a softening point of 130° C., "mold release PET") subjected to mold release treatment with an alkyd resin-based mold release agent ("AL-5" manufactured by Lintec Corporation) was prepared.

Each of the resin varnishes was applied to the mold release PET uniformly by a die coater such that the thickness of the resin composition layer after being dried would be 40 μm (for the measurement of the average coefficient of linear thermal expansion, the boiling water absorption rate, and the moisture permeation) and was dried at 80° C. to 110° C. for 3.5 minutes to obtain a resin composition layer on the mold release PET. Next, a polypropylene film ("Alphan MA-430" manufactured by Oji F-Tex Co., Ltd. with a thickness of 20 μm) as a protective film was laminated on the face that does not bond to the support of the support-attached resin sheet so as to bond to the resin composition layer. With this lamination, a support-attached resin sheet including the support, the resin composition layer, and the protective film in this order (for the measurement of the average coefficient of linear thermal expansion, the boiling water absorption rate, and the moisture permeation) was obtained.

Each of the resin varnishes was applied to the mold release PET uniformly by a die coater such that the thickness of the resin composition layer after being dried would be 22 μm (for the measurement of the lowest melt viscosity and the evaluation of component embeddability) and was dried at 80° C. to 110° C. for 2 minutes to obtain a resin composition layer on the mold release PET. Next, a polypropylene film ("Alphan MA-430" manufactured by Oji F-Tex Co., Ltd. with a thickness of 20 μm) as a protective film was laminated on the face that does not bond to the support of the support-attached resin sheet so as to bond to the resin composition layer. With this lamination, a support-attached resin sheet including the support, the resin composition layer, and the protective film in this order (for the measurement of the lowest melt viscosity and the evaluation of component embeddability) was obtained.

Each of the resin varnishes was applied to the mold release PET uniformly by a die coater such that the thickness of the resin composition layer after being dried would be 10 μm (for the evaluation of thin film insulation performance) and was dried at 70° C. to 100° C. for 1.5 minutes to obtain a resin composition layer on the mold release PET. Next, a polypropylene film ("Alphan MA-430" manufactured by Oji F-Tex Co., Ltd. with a thickness of 20 μm) as a protective film was laminated on the face that does not bond to the support of the support-attached resin sheet so as to bond to the resin composition layer. With this lamination, a support-attached resin sheet including the support, the resin composition layer, and the protective film in this order (for the evaluation of thin film insulation performance) was obtained.

Measurement of Lowest Melt Viscosity

Only the resin composition layer (with a thickness of 22 μm) was peeled off from the mold release PET (the support) and was compressed by a mold to manufacture pellets for measurement (with a diameter of 18 mm, 1.2 to 1.3 g).

Using a dynamic viscoelasticity measuring apparatus ("Rheosol-G3000" manufactured by UBM Co., Ltd.), while the temperature of 1 g of a sample resin composition layer was raised from a starting temperature of 60° C. to 200° C. at a temperature rising rate of 5° C./minute using a parallel plate with a diameter of 18 mm, a dynamic viscoelastic modulus was measured under the measurement conditions of a measurement temperature interval of 2.5° C., a frequency of 1 Hz, and a strain of 1 degree, and the lowest melt viscosity (poise) was calculated.

Measurement of Average Coefficient of Linear Thermal Expansion (CTE) of Cured Product of Support-Attached Resin Sheet A mold release PET film ("501010" manufactured by Lintec Corporation with a thickness of 38 μm and 240 mm square) was placed on a glass cloth-based epoxy resin double-sided copper-clad laminate ("R5715ES" manufactured by Matsushita Electric Works, Ltd. with a thickness of 0.7 mm and 255 mm square) such that an untreated face of the mold release PET film would be in contact with the glass cloth-based epoxy resin double-sided copper-clad laminate, and the four sides of the mold release PET film were fixed with polyimide adhesive tape (with a width of 10 mm).

Each of the support-attached resin sheets (with a thickness of 40 μm and 200 mm square) manufactured in the examples and the comparative examples was subjected to lamination treatment at the center such that the resin composition layer would be in contact with the mold release face of the mold release PET film ("501010" manufactured by Lintec Corporation) using a batch vacuum pressurizing laminator (a two-stage build-up laminator CVP700 manufactured by Nichigo-Morton Co., Ltd.). The lamination treatment was performed by reducing pressure for 30 seconds to make the atmospheric pressure 13 hPa or lower and then performing compression bonding for 30 seconds at 100° C. and a pressure of 0.74 MPa.

Next, thermal curing was performed for 30 minutes after being put into a 100° C. oven under a temperature condition of 100° C. and then for 30 minutes after being moved to a 175° C. oven under a temperature condition of 175° C. After that, the substrate was taken out to a nitrogen atmosphere, the mold release PET (the support) was peeled off from the support-attached resin sheet, and further the support-attached resin sheet was put into a 190° C. oven to be thermally cured under a curing condition of 90 minutes.

After thermal curing, the polyimide adhesive tape was peeled off, and the cured product was removed from the glass cloth-based epoxy resin double-sided copper-clad laminate. Furthermore, the mold release PET film ("501010" manufactured by Lintec Corporation) on which the resin composition layer had been laminated was peeled off to obtain a sheet-shaped cured product. The obtained cured product is referred to as a "cured product for evaluation."

The cured product for evaluation was cut into a test piece with a width of 5 mm and a length of 15 mm and was subjected to thermomechanical analysis by a tensile load method using a thermomechanical analyzer (Thermo Plus TMA8310 manufactured by Rigaku Corporation). Specifically, the test piece was mounted on the thermomechanical analyzer and was measured twice successively under the measurement conditions of a load of 1 g and a temperature rising rate of 5° C./minute. In the two pieces of measurement, an average coefficient of linear thermal expansion (ppm/° C.) in a planar direction in the range of from 25° C. to 150° C. was calculated.

Measurement of Boiling Water Absorption Rate

The cured product for evaluation (with a thickness of 40 μm) was cut into a test piece with 40 mm square, and the test piece was weighed after being dried at 130° C. for 30 minutes (this weighed mass is referred to as A (g)). The test piece was immersed into boiled ion exchanged water for 1 hour. After that, the test piece was immersed into ion exchanged water at room temperature (25° C.) for 1 minute, water droplets on the surface of the test piece were wiped off with a clean wiper (manufactured by Kuraray Kuraflex Co., Ltd.), and the test piece was weighed (this weighed mass is referred to as B (g)). The boiling water absorption rates of five test pieces were determined from the following equation, and the average thereof was listed in the following table.

Boiling water absorption rate (% by mass)=$((B-A)/A) \times 100$

Measurement of Moisture Permeation

The cured product for evaluation (with a thickness of 40 μm) was cut into a cylindrical shape with a diameter of 70 mm, and the measurement of moisture permeability thereof was performed in accordance with the method of moisture permeability test (the cup method) of JIS Z0208. Specifically, the weight of water that has passed through a sample for 24 hours at 60° C. and 85% RH was measured to determine moisture permeability (g/m²·24 h), which was divided by the film thickness to calculate the moisture permeation (g·mm/m²·24 h). The average of three test pieces was listed in the following table.

Evaluation of Component Embeddability

Using each of the support-attached resin sheets (with a thickness of 22 μm) manufactured in the examples and the comparative examples, a component temporarily mounting inner layer board was manufactured along the following procedure, and the component embeddability thereof was evaluated.

(1) Preparation of Component Temporarily Mounting Inner Layer Board (Cavity Board)

Cavities with 0.7 mm×1.1 mm were formed with a pitch of 3 mm on the whole face of a glass cloth-based BT resin double-sided copper-clad laminate (with a copper foil thickness of 18 μm and a substrate thickness of 0.15 mm "HL832NSF LCA" manufactured by Mitsubishi Gas Chemical Company, Inc.) with sizes of 255 mm×340 mm. Next, both faces were etched by 1 μm with micro etchant ("CZ8100" manufactured by Mec Company Ltd.) to perform roughening treatment on the copper surface, were further subjected to rustproofing treatment ("CL8300" manufactured by Mec Company Ltd.), and were dried at 180° C. for 30 minutes.

(2) Manufacture of Component Temporarily Mounting Inner Layer Board (Cavity Board)

An adhesive-attached polyimide film with a thickness of 25 μm (with a polyimide thickness of 38 μm, "PFDKE-1525TT" manufactured by Arisawa Mfg. Co., Ltd.) was placed on one face of the substrate obtained at (1) such that the adhesive would bond to the substrate and was laminated on the one face using a batch vacuum pressurizing laminator (a two-stage build-up laminator "CVP700" manufactured by Nichigo-Morton Co., Ltd.). The lamination was performed by reducing pressure for 30 seconds to make the atmospheric pressure 13 hPa or lower and then performing compression bonding for 30 seconds at 80° C. and a pressure of 0.74 MPa. Next, multilayer ceramic capacitors (1005=sizes of 1×0.5 mm and a thickness of 0.14 mm) were temporarily mounted in the cavities one by one to manufacture a component temporarily mounting inner layer board (a cavity board).

(3) Evaluation Test for Component Embeddability

Using a batch vacuum pressurizing laminator (a two-stage build-up laminator "CVP700" manufactured by Nichigo-Morton Co., Ltd.), the resin composition layer exposed by peeling off the protective film from each of the support-attached resin sheets (with a thickness of 22 μm) manufactured in the examples and the comparative examples and the face opposite to the face arranging the adhesive-attached polyimide film of the component temporarily mounting inner layer board manufactured at (2) were laminated on each other such that they bond to each other. The lamination was performed by reducing pressure for 30 seconds to make the atmospheric pressure 13 hPa or lower and then performing compression bonding for 30 seconds at 120° C. and a pressure of 0.74 MPa. Next, the laminated support-attached resin sheet was hot pressed for 60 seconds under atmospheric pressure at 120° C. and a pressure of 0.5 MPa to be smoothened. The adhesive-attached polyimide film was peeled off from the component temporarily mounting inner layer board cooled to room temperature to manufacture Board A for Evaluation. A resin flow within the cavity was observed from the face from which the polyimide film has been peeled off of Board A for Evaluation with an optical microscope (150× magnification) (observed for 10 cavities), component embeddability was evaluated based on the following criteria, and the results were listed in the following table.

Evaluation Criteria

Pass: In all the cavities, the periphery of the multilayer ceramic capacitor component is covered with the resin.

Fail: In any one of the cavities, a void occurs, or the periphery of the multilayer ceramic capacitor component is not filled with the resin.

Evaluation of Amount of Warpage (1) Curing of Resin Sheet

Board A for Evaluation manufactured at "(3) Evaluation Test for Component Embeddability" was put into a 100° C. oven under a temperature condition of 100° C., was subjected to heat treatment for 30 minutes, and was cooled to room temperature. On the face from which the adhesive-attached polyimide film has been peeled off, the same support-attached resin sheet was laminated under the same conditions as those of "(3) Evaluation Test for Component Embeddability." After that, thermal curing was performed for 30 minutes after being put into a 100° C. oven under a temperature condition of 100° C. and then for 30 minutes after being moved to a 175° C. oven under a temperature condition of 175° C. to form the insulating layers on both faces of the substrate. After that, the substrate formed with the insulating layers on both faces was taken out to a nitrogen atmosphere, the mold release PET on both faces was peeled off, was put into a 190° C. oven, and the insulating layers were thermally cured under a curing condition of 90 minutes to manufacture a circuit board with built-in component, which was referred to as Board B for Evaluation.

(2) Evaluation Test for Amount of Warpage

Board B for Evaluation was cut into a piece with 45 mm square (five pieces were prepared) and was passed through a reflow apparatus ("HAS-6116" manufactured by Antom Co., Ltd.) that reproduces a solder reflow temperature at a peak temperature of 260° C. once (a reflow temperature profile conforms to IPC/JEDEC J-STD-020C). Next, using a shadow moire apparatus ("TherMoire AXP" manufactured by Akrometrix), the lower face of the substrate was heated in accordance with the reflow temperature profile conforming to IPC/JEDEC J-STD-020C (with a peak temperature of 260° C.), and the displacement ($\mu$m) of a part with 10 mm square at the center of the substrate was measured. The results were listed in the following table.

Evaluation of Insulation Reliability and Measurement of Thickness of Insulating Layer between Conductor Layers (Preparation of Board for Evaluation)

(1) Substrate Treatment on Inner Layer Circuit Board

As the inner layer circuit board, a glass cloth-based BT resin double-sided copper-clad laminate (with a copper foil thickness of 18 $\mu$m and a substrate thickness of 0.3 mm, "R1515F" manufactured by Panasonic Corporation) having a circuit conductor (copper) formed by a wiring pattern of a grid with 1 mm square (with a residual copper rate of 70%) on both faces was prepared. Both faces of the inner layer circuit board were immersed into "CZ8100" manufactured by Mec Company Ltd. to perform roughening treatment on the copper surface (with a copper etching amount of 0.7 $\mu$m).

(2) Lamination of Support-Attached Resin Sheet

Each of the support-attached resin sheets manufacture in the examples and the comparative examples was laminated on both faces of the inner layer circuit board such that the resin composition layer would be in contact with the inner layer circuit board using a batch vacuum pressurizing laminator (a two-stage build-up laminator CVP700 manufactured by Nichigo-Morton Co., Ltd.). The lamination was performed by reducing pressure for 30 seconds to make the atmospheric pressure 13 hPa or lower and then performing compression bonding for 30 seconds at 120° C. and a pressure of 0.74 MPa. Next, hot press was performed for 60 seconds at 120° C. and a pressure of 0.5 MPa.

(3) Thermal Curing of Resin Composition Layer

The inner layer circuit board laminated with the support-attached resin sheet was thermally cured for 30 minutes after being put into a 100° C. oven under a temperature condition of 100° C. and then for 30 minutes after being moved to a 175° C. oven under a temperature condition of 175° C. to form the insulating layer.

(4) Formation of Via Hole

From above the insulating layer and the support, using a $CO_2$ laser processing machine "605GTWIII(-P)" manufactured by Mitsubishi Electric Corporation, a laser was applied from above the support to form a via hole with a top diameter (of 70 $\mu$m) in the insulating layer on a grid pattern conductor. Laser irradiation was performed under the conditions of a mask diameter of 2.5 mm, a pulse width of 16 $\mu$s, an energy of 0.39 mJ/shot, a shot number of 2, and a burst mode (10 kHz).

(5) Process of Performing Roughening Treatment

The support was peeled off from the circuit board formed with the via hole, and desmear treatment was performed. For the desmear treatment, the following wet desmear treatment was performed.

Wet Desmear Treatment:

The circuit board was immersed in a swelling liquid ("Swelling Dip Securiganth P," an aqueous solution of diethylene glycol monobutyl ether and sodium hydroxide manufactured by Atotech Japan K.K.) at 60° C. for 5 minutes, was next immersed in an oxidizer solution ("Concentrate Compact CP," an aqueous solution with a potassium permanganate concentration of about 6% and with a sodium hydroxide concentration of about 4% manufactured by Atotech Japan K.K.) at 80° C. for 10 minutes, was finally immersed in a neutralizing liquid ("Reduction Solution Securiganth P," an aqueous sulfuric acid solution manufactured by Atotech Japan K.K.) at 40° C. for 5 minutes, and was then dried at 80° C. for 15 minutes.

(6) Process of Forming Conductor Layer (6-1) Electroless Plating Process

To form a conductor layer on the surface of the circuit board, a plating process including the following 1 to 6 processes (a copper plating process using chemical solutions manufactured by Atotech Japan K.K.) was performed to form the conductor layer.

1. Alkaline cleaning (cleaning and electric charge adjustment of the surface of the insulating layer formed with the via hole)

Using Cleaning Cleaner Securiganth 902 (product name), the surface was cleaned at 60° C. for 5 minutes.

2. Soft etching (cleaning of the inside of the via hole)

Using a sulfuric acid-acidic aqueous sodium peroxodisulfate solution, treatment was performed at 30° C. for 1 minute.

3. Predip (adjustment of the electric charges on the surface of the insulating layer for the impartment of Pd)

Using Pre. Dip Neoganth B (product name), treatment was performed at room temperature for 1 minute.

4. Impartment of activator (impartment of Pd to the surface of the insulating layer)

Using Activator Neoganth 834 (product name), treatment was performed at 35° C. for 5 minutes.

5. Reduction (reduction of Pd imparted to the insulating layer)

Using a mixed liquid of Reducer Neoganth WA (product name) and Reducer Accelerator 810 mod. (product name), treatment was performed at 30° C. for 5 minutes.

6. Electroless copper plating process (precipitation of Cu on the surface (the Pd surface) of the insulating layer)

Using a mixed liquid of Basic Solution Printganth MSK-DK (product name), Copper Solution Printganth MSK (product name), Stabilizer Printganth MSK-DK (product name), and Reducer Cu (product name), treatment was performed at 35° C. for 20 minutes. The thickness of the formed electroless copper plated layer was 0.8 μm.

(6-2) Electroplating Process

Next, using a chemical solution manufactured by Atotech Japan K.K., a copper electroplating process was performed under the condition that the via hole is filled with copper. After that, using a land pattern with a diameter of 1 mm communicating with the via hole and a circular conductor pattern with a diameter of 10 mm that is not connected to the lower layer conductor as a resist pattern for patterning by etching, a conductor layer having the land and the conductor pattern with a thickness of 10 μm was formed on the surface of the insulating layer. Next, annealing treatment was performed at 190° C. for 90 minutes. This board was referred to as Board C for Evaluation.

Measurement of Thickness of Insulating Layer between Conductor Layers

Board C for Evaluation was subjected to section observation using an FIB-SEM hybrid apparatus ("SMI3050SE" manufactured by SII NanoTechnology Inc.). Specifically, a section in a direction perpendicular to the surface of the conductor layer was scraped out by a focused ion beam (FIB), and the thickness of the insulating layer between the conductor layers was measured from a sectional SEM image. For each sample, sectional SEM images at five randomly selected points were observed, and their average was determined to be the thickness of the insulating layer between the conductor layers.

Evaluation of Insulation Reliability of Insulating Layer

With the 10 mm diameter circular conductor side of Board C for Evaluation obtained as described above a plus electrode and with the grid conductor (copper) side of the inner layer circuit board connected to the land with a diameter of 1 mm as a minus electrode, using a highly accelerated life test apparatus ("PM422" manufactured by ETAC), an insulation resistance value after the elapse of 200 hours under the conditions of 130° C., 85RH %, and the application of 3.3 V DC voltage was measured by an electrochemical migration tester ("ECM-100" manufactured by J-RAS Corporation) (n=6). A case when the resistance values in all the six test pieces were $10^7 \Omega$ or higher was evaluated to be "pass," whereas a case when any one of them was lower than $10^7 \Omega$ was evaluated to be "fail."

|  |  | Example | | | Comparative Example | | |
|---|---|---|---|---|---|---|---|
|  |  | 1 | 2 | 3 | 1 | 2 | 3 |
|  |  | Resin vanish (resin composition layer) | | | | | |
|  |  | Resin vanish 1 | Resin vanish 2 | Resin vanish 3 | Resin vanish 4 | Resin vanish 5 | Resin vanish 6 |
| Component (C) | Type | UFP-30 | SPH516-05 | UFP-30 SPH516-05 | UFP-40 | SO-C1 | SPH516-05 |
|  | Filled amount (% by mass) | 61 | 72 | 65 | 61 | 65 | 63 |
|  | Average particle diameter (μm) | 0.075 | 0.29 | 0.13 | 0.067 | 0.63 | 0.29 |
|  | Specific surface area (m²/g) | 30.7 | 16.3 | 26.1 | 40.8 | 11.2 | 16.3 |
|  | True density (g/cm³) | 2.25 | 2.25 | 2.25 | 2.25 | 2.25 | 2.25 |
|  | Specific surface are (m²/g) × True density (g/cm³) | 69.1 | 36.7 | 58.7 | 91.8 | 25.2 | 36.7 |
| Cured product | Boiling water absorption rate (% by mass) | 0.56 | 0.31 | 0.45 | 0.60 | 0.52 | 0.69 |
|  | Moisture permeance (g · mm/m² · 24 h) | 2.3 | 1.4 | 1.8 | 2.4 | 1.9 | 2.9 |
| Resin composition layer | Lowest melt viscosity (poise) | 2800 | 3100 | 2600 | 13900 | 1100 | 2900 |
| Evaluation | Thickness of insulating layer between conductor layers (μm) | 4.6 | 4.9 | 4.8 | Not evaluated | 5 | 4.9 |
|  | Insulation reliability Resistance value (Ω) | 109 | 108 | 109 | Not evaluated | 104 | 104 |
|  | Evaluation | Pass | Pass | Pass | Not evaluated | Fail | Fail |
|  | Amount of reflow warpage (μm) | 68 | 59 | 63 | Not evaluated | 62 | 65 |
|  | Component embeddability | Pass | Pass | Pass | Fail | Pass | Pass |
|  | CTE (ppm/° C.) | 25 | 18 | 22 | 26 | 22 | 24 |

From the table, it is seen that in Examples 1 to 3 of the present invention, the amount of reflow warpage was small and embeddability and thin film insulation performance were excellent even when the thickness of the insulating layer between the conductor layers was small. In contrast, Comparative Example 1, in which the product of the specific surface area and the true density of the inorganic filler was out of the range of 1 to 77, produced the surface irregularities (undulation) of the resin composition layer and was unable to evaluate the thickness of the insulating layer between the conductor layers, insulation reliability, and the amount of reflow warpage. It is seen that Comparative Example 2, in which the average particle diameter of the inorganic filler is out of the range of 0.05 to 0.35 μm, and Comparative Example 3, in which the moisture permeation is out of the range of 0.05 to 2.8 g·mm/m²·24 h, are inferior to Examples 1 to 3 in insulation reliability.

Where a numerical limit or range is stated herein, the endpoints are included. Also, all values and subranges within a numerical limit or range are specifically included as if explicitly written out.

As used herein the words "a" and "an" and the like carry the meaning of "one or more."

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

The invention claimed is:

1. A resin composition, comprising:
   (A) an epoxy resin;
   (B) a curing agent; and
   (C) an inorganic filler,
   Wherein a content of © said inorganic filler is 55% by mass or higher with respect to 100% by mass of a non-volatile component within the resin composition'
   An average particle diameter of © said inorganic filler is 0.05 to 0.35 μm,
   A product of a specific surface area ($m^2/g$) of © said inorganic filler and a true Density ($g/cm^3$) of © said inorganic filler is 1 to 77, and
   a moisture permeation of a cured product obtained by thermally curing said resin Composition is 0.05 to 2.8 g·mm/$m^2$·34 h, wherein the product of the specific Surface area of said component © and the true density of said component © is 26 to 77.

2. The resin composition according to claim 1, wherein the product of the specific surface area of said component (C) and the true density of said component (C) is 26 to 77.

3. The resin composition according to claim 1, wherein the moisture permeation of said cured product obtained by thermally cured said resin composition is 0.05 to 2.5 g·mm/$m^2$·24 h.

4. The resin composition according to claim 1, wherein an average coefficient of linear thermal expansion at 25° C. to 150° C. of said cured product obtained by thermally curing said resin composition is 26 ppm/° C. or lower.

5. The resin composition according to claim 1, wherein said component (C) is surface treated with at least one surface treating agent selected from the group consisting of a silane coupling agent, an alkoxysilane compound, and an organosilazane compound.

6. The resin composition according to claim 1, wherein said component (B) is one or more curing agents selected from the group consisting of an activated ester-based curing agent and a cyanate ester-based curing agent.

7. A cured product, obtained by thermally curing a resin composition according to claim 1.

8. A support-attached resin sheet, comprising:
   a support, and
   a resin composition layer, comprising a resin composition according to claim 1 provided on said support.

9. The support-attached resin sheet according to claim 8, wherein said resin composition layer has a thickness of 12 μm or less.

10. The support-attached resin sheet according to claim 8, wherein said resin composition layer has a lowest melt viscosity of 12,000 poise or less.

11. A method for manufacturing a printed wiring board, the method comprising:
    (I) laminating a support-attached resin sheet according to claim 8 such that said resin composition layer of the support-attached resin sheet bonds to an inner layer board; and
    (II) thermally curing said resin composition layer to form an insulating layer.

12. The method for manufacturing a printed wiring board according to claim 11, wherein
    said printed wiring board comprises a first conductor layer and a second conductor layer, and
    said insulating layer is between said first and said second conductor layers and has a thickness of 6 μm or less.

13. A printed wiring board comprising:
    an insulating layer formed of a cured product of said resin composition according to claim 1;
    a first conductor layer; and
    a second conductor layer.

14. The printed wiring board according to claim 13, wherein said insulating layer is between said first and said second conductor layers and has a thickness of 6 μm or less.

15. A semiconductor device, comprising a printed wiring board according to claim 13.

* * * * *

UNITED STATES PATENT AND TRADEMARK OFFICE
CERTIFICATE OF CORRECTION

PATENT NO. : 9,711,446 B2
APPLICATION NO. : 15/363166
DATED : July 18, 2017
INVENTOR(S) : Shigeo Nakamura et al.

Page 1 of 1

It is certified that error appears in the above-identified patent and that said Letters Patent is hereby corrected as shown below:

In the Claims

In Claim 1, Column 39, Lines 20-32:
"Wherein a content of © said inorganic filler is 55% by mass or higher with respect to 100% by mass of a non-volatile component within the resin composition'
An average particle diameter of © said inorganic filler is 0.05 to 0.35 μm,
A product of a specific surface area (m$^2$/g) of © said inorganic filler and a true Density (g/cm$^3$) of © said inorganic filler is 1 to 77, and
a moisture permeation of a cured product obtained by thermally curing said resin Composition is 0.05 to 2.8 g·mm/m$^2$·34 h, wherein the product of the specific Surface area of said component © and the true density of said component © is 26 to 77."

Should read:
--wherein
a content of (C) said inorganic filler is 55% by mass or higher with respect to 100% by mass of a non-volatile component within the resin composition,
an average particle diameter of (C) said inorganic filler is 0.05 to 0.35 μm,
a product of a specific surface area (m$^2$/g) of (C) said inorganic filler and a true density (g/cm$^3$) of (C) said inorganic filler is 1 to 77, and
a moisture permeation of a cured product obtained by thermally curing said resin composition is 0.05 to 2.8 g·mm/m$^2$·24 h,
wherein a boiling water absorption rate per hour of a cured product with a thickness of 40 μm and 4 cm square obtained by thermally curing said resin composition is 0.65% by mass or lower.--

Signed and Sealed this
Twenty-fifth Day of February, 2020

Andrei Iancu
*Director of the United States Patent and Trademark Office*